United States Patent
Fujinaga et al.

(10) Patent No.: US 9,758,720 B2
(45) Date of Patent: Sep. 12, 2017

(54) OXYNITRIDE PHOSPHOR POWDER, SILICON NITRIDE POWDER FOR PRODUCTION OF OXYNITRIDE PHOSPHOR POWDER, AND PRODUCTION METHOD OF OXYNITRIDE PHOSPHOR POWDER

(71) Applicant: Ube Industries, Ltd., Ube-shi (JP)

(72) Inventors: Masataka Fujinaga, Ube (JP); Takayuki Ueda, Ube (JP); Takuma Sakai, Ube (JP); Shinsuke Jida, Ube (JP)

(73) Assignee: Ube Industries, Ltd. (JP)

( * ) Notice: Subject to any disclaimer, the term of this patent is extended or adjusted under 35 U.S.C. 154(b) by 580 days.

(21) Appl. No.: 14/350,929

(22) PCT Filed: Oct. 12, 2012

(86) PCT No.: PCT/JP2012/076485
§ 371 (c)(1),
(2) Date: Apr. 10, 2014

(87) PCT Pub. No.: WO2013/054901
PCT Pub. Date: Apr. 18, 2013

(65) Prior Publication Data
US 2014/0264170 A1    Sep. 18, 2014

(30) Foreign Application Priority Data

Oct. 12, 2011 (JP) ................ 2011-224827
Mar. 28, 2012 (JP) ................ 2012-072792
Mar. 29, 2012 (JP) ................ 2012-075602

(51) Int. Cl.
*C09K 11/77* (2006.01)
*C01B 21/082* (2006.01)
(Continued)

(52) U.S. Cl.
CPC ...... *C09K 11/7728* (2013.01); *C01B 21/0821* (2013.01); *C01B 21/0826* (2013.01);
(Continued)

(58) Field of Classification Search
CPC .................................. C09K 11/7734
See application file for complete search history.

(56) References Cited

U.S. PATENT DOCUMENTS 7,906,040 B2 *  3/2011  Mitomo ........... C04B 35/597
                                              252/301.4 F
8,628,687 B2 *  1/2014  Yamao ........... C04B 35/597
                                              252/301.4 F
(Continued)

FOREIGN PATENT DOCUMENTS

CN    101842461    9/2010
EP    1 445 295    8/2004
(Continued)

OTHER PUBLICATIONS

Li. Phase Purity and Luminescence Properties of Fine Ca-alpha-SiAlON:Eu Phosphors Synthesized by Gas Reduction Nitridation Method. Journal of the Electrochemical Society, 155 6 J175-J179 (2008).*
(Continued)

*Primary Examiner* — Matthew E Hoban
(74) *Attorney, Agent, or Firm* — DLA Piper LLP (US)

(57) ABSTRACT

An oxynitride phosphor powder contains α-SiAlON and aluminum nitride, obtained by mixing a silicon source, an aluminum source, a calcium source, and a europium source to produce a composition represented by a compositional formula: $Ca_{x1}Eu_{x2}Si_{12-(y+z)}Al_{(y+z)}O_zN_{16-z}$ (wherein x1, x2, y and z are $0<x1\leq3.40$, $0.05\leq x2\leq0.20$, $4.0\leq y\leq7.0$, and $0\leq z\leq1$), and firing the mixture.

17 Claims, 4 Drawing Sheets

(51) Int. Cl.
*C09K 11/08* (2006.01)
*H05B 33/14* (2006.01)
*H01L 33/50* (2010.01)

(52) U.S. Cl.
CPC ...... *C09K 11/0883* (2013.01); *C09K 11/7734* (2013.01); *H05B 33/14* (2013.01); *C01P 2002/54* (2013.01); *C01P 2002/72* (2013.01); *C01P 2002/77* (2013.01); *C01P 2002/84* (2013.01); *C01P 2004/03* (2013.01); *C01P 2004/04* (2013.01); *C01P 2004/62* (2013.01); *C01P 2006/12* (2013.01); *H01L 33/502* (2013.01)

(56) References Cited

U.S. PATENT DOCUMENTS

| | | | |
|---|---|---|---|
| 9,200,200 B2* | 12/2015 | Park | C09K 11/0883 |
| 2003/0030038 A1* | 2/2003 | Mitomo | C04B 35/597 252/500 |
| 2003/0168643 A1 | 9/2003 | Mitomo et al. | |
| 2004/0155225 A1* | 8/2004 | Yamada | C04B 35/597 252/301.4 R |
| 2005/0012075 A1* | 1/2005 | Sakata | C04B 35/597 252/301.4 F |
| 2005/0116244 A1* | 6/2005 | Sakata | C04B 35/597 257/98 |
| 2005/0194604 A1 | 9/2005 | Sakuma et al. | |
| 2007/0108896 A1 | 5/2007 | Hirosaki | |
| 2008/0309220 A1* | 12/2008 | Sakata | C04B 35/597 313/503 |
| 2009/0085465 A1* | 4/2009 | Hirosaki | C01B 21/082 313/503 |
| 2010/0072498 A1* | 3/2010 | Xie | C04B 35/597 257/98 |
| 2010/0208481 A1 | 8/2010 | Miyake et al. | |
| 2013/0020533 A1* | 1/2013 | Fujinaga | C09K 11/7734 252/301.4 F |
| 2013/0140490 A1 | 6/2013 | Fujinaga et al. | |
| 2013/0153824 A1 | 6/2013 | Fujinaga et al. | |

FOREIGN PATENT DOCUMENTS

| | | |
|---|---|---|
| EP | 1 772 509 | 4/2007 |
| EP | 2 022 834 | 2/2009 |
| EP | 2 141 215 | 1/2010 |
| JP | 09-040406 A | 2/1997 |
| JP | 2002-097005 A | 4/2002 |
| JP | 2002-363554 | 12/2002 |
| JP | 2002-363554 A | 12/2002 |
| JP | 2003-112977 A | 4/2003 |
| JP | 2005-008794 A | 1/2005 |
| JP | 2005-154611 A | 6/2005 |
| JP | 2009-096882 | 5/2009 |
| JP | 2009-096882 A | 5/2009 |
| JP | 2009-096883 | 5/2009 |
| JP | 2009-096883 A | 5/2009 |
| JP | 2010-031201 A | 2/2010 |
| JP | 2005-008794 | 1/2013 |
| WO | 2005/123876 A1 | 12/2005 |
| WO | 2006/080535 A1 | 8/2006 |
| WO | 2008/010498 | 1/2008 |
| WO | 2009/048150 A1 | 4/2009 |
| WO | 2009/050171 | 4/2009 |
| WO | 2011/055665 | 5/2011 |
| WO | 2012/023414 A1 | 2/2012 |

OTHER PUBLICATIONS

Hirosaki, N., et al., "Effect of Grain Growth of β-Silicon Nitride on Strength, Weibull Modulus, and Fraacture Toughness," *J. Am. Ceram. Soc.*, 1993, 76[7], pp. 1892-1894.

Supplementary Partial European Search Report dated May 4, 2015 from corresponding European Patent Application No. 12 84 0554.

"Study on Production of Rare Earth Element-Doped α-SiAlON Light Conversion Material for White Light-Emitting Diode and Light-Emitting Performance Thereof," Oct. 29, 2010, pp. 10 to 22, one sheet of English abstract.

* cited by examiner

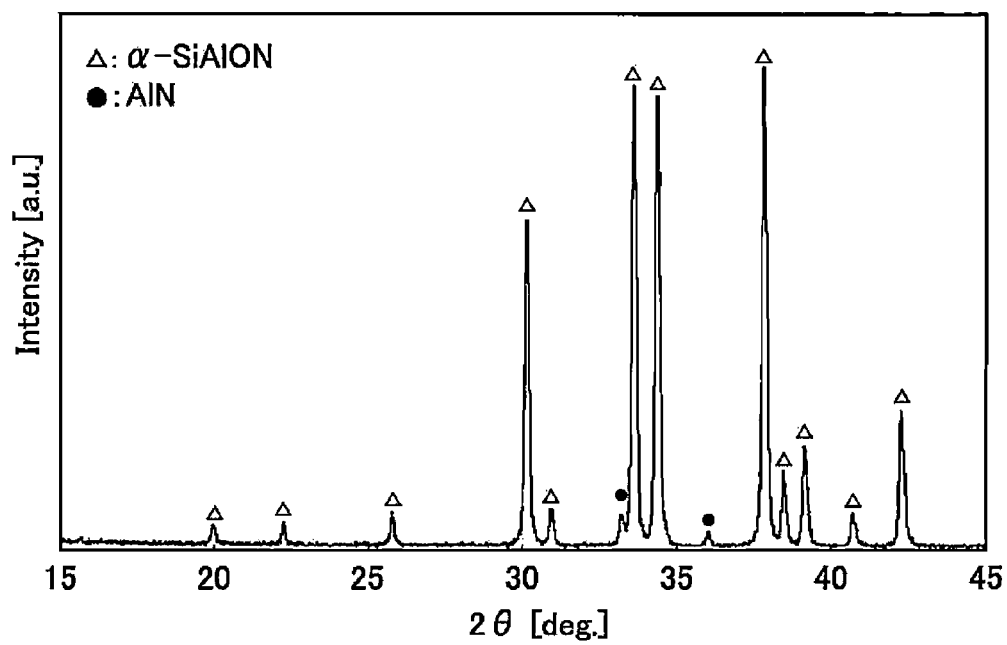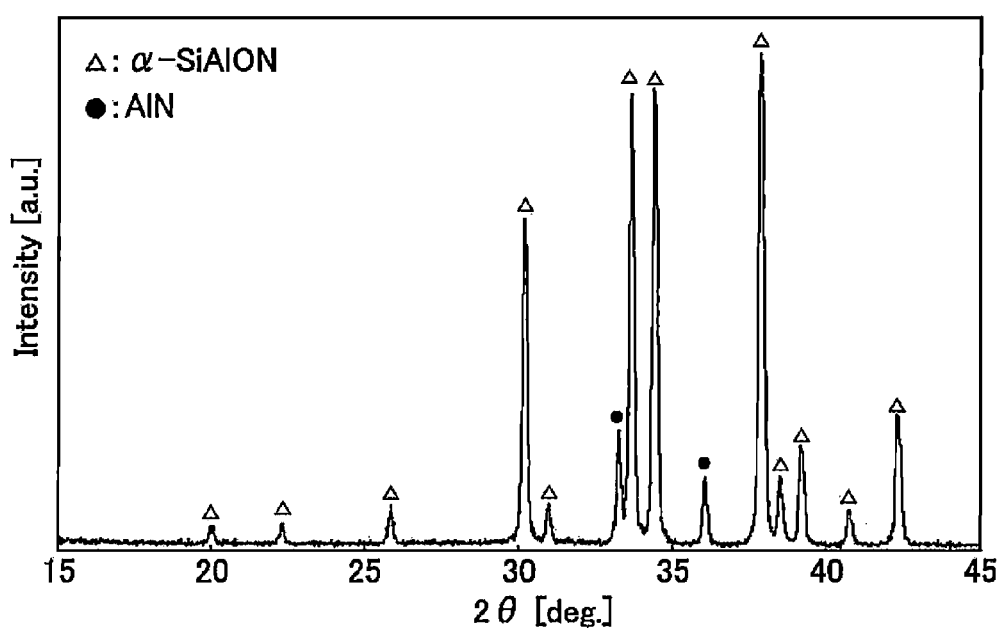

OXYNITRIDE PHOSPHOR POWDER, SILICON NITRIDE POWDER FOR PRODUCTION OF OXYNITRIDE PHOSPHOR POWDER, AND PRODUCTION METHOD OF OXYNITRIDE PHOSPHOR POWDER

TECHNICAL FIELD

The present invention relates to an oxynitride phosphor powder composed of a rare earth metal element-activated α-SiAlON and aluminum nitride, which is suitable for an ultraviolet-blue light source, a silicon nitride powder for production of the oxynitride phosphor powder, and a production method. More specifically, the present invention relates to an oxynitride phosphor powder having a fluorescence peak wavelength in the range of 595 to 605 nm and exhibiting practical external quantum efficiency and fluorescence intensity, a silicon nitride powder for production of the oxynitride phosphor powder, and a production method.

BACKGROUND ART

Recently, with practical implementation of a blue light-emitting diode (LED), development of a white LED using this blue LED is being aggressively pursued. The white LED ensures low power consumption and extended life compared with existing white light sources and therefore, its application to liquid crystal panel backlight, indoor or outdoor lighting device, and the like is expanding.

The white LED developed at present is obtained by coating a Ce-doped YAG (yttrium.aluminum.garnet) on the surface of blue LED. However, the fluorescence peak wavelength of Ce-doped YAG is in the vicinity of 530 nm and when this fluorescence color and light of blue LED are mixed to produce white light, the light is slightly blue-tinted. This kind of white LED has a problem of poor color rendering property.

To cope with this problem, many oxynitride phosphors are being studied and among others, an Eu-activated α-SiAlON phosphor is known to emit fluorescence (yellow-orange) with a peak wavelength of around 580 nm that is longer than the fluorescence peak wavelength of Ce-doped YAG (see, Patent Document 1). When a white LED is fabricated by using the α-SiAlON phosphor above or by combining it with a Ce-doped YAG phosphor, a white LED giving an incandescent color at a lower color temperature than a white LED using only Ce-doped YAG can be produced.

However, as a Ca-containing α-SiAlON phosphor activated with Eu, represented by the formula:

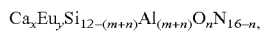

$Ca_xEu_ySi_{12-(m+n)}Al_{(m+n)}O_nN_{16-n}$, a phosphor having a high luminance enough for practical use has not been developed yet.

Patent Document 2 discloses a phosphor exhibiting excellent luminous efficiency and having a fluorescence peak at a wavelength of 595 nm or more, and a production method thereof, where a smooth-surface particle larger than ever before is obtained by adding a previously synthesized α-SiAlON powder as a seed crystal for grain growth to the raw material powder and a powder having a specific particle size is obtained from the synthesized powder without applying a pulverization treatment.

Specifically, an α-SiAlON phosphor which is an α-SiAlON phosphor (x+y=1.75, O/N=0.03) having a composition of $(Ca_{1.67},Eu_{0.08})(Si,Al)_{12}(O,N)_{16}$ and in which the peak wavelength of the fluorescence spectrum obtained by excitation with blue light of 455 nm is from 599 to 601 nm and the luminous efficiency (=external quantum efficiency=absorptivity×internal quantum efficiency) is from 61 to 63%, is disclosed.

However, in the document above, specific examples of a phosphor having a florescence peak wavelength of less than 599 nm and a phosphor of more than 601 nm, each having a luminous efficiency enough for practical use, are not illustrated.

Patent Document 3 discloses: a light-emitting device characterized by using a phosphor containing, as a main component, an α-SiAlON represented by the formula: $(Ca_\alpha, Eu_\beta)(Si,Al)_{12}(O,N)_{16}$ (provided that $1.5<\alpha+\beta<2.2, 0<\beta<0.2$ and $O/N \leq 0.04$) and having a specific surface area of 0.1 to 0.35 m²/g; a vehicle lighting device using the same; and a headlamp.

The document above discloses working examples of an α-SiAlON phosphor, where the peak wavelengths of the fluorescence spectrums obtained by excitation with blue light of 455 nm are 592, 598 and 600 nm and the luminous efficiencies (=external quantum efficiency) thereof are 61.0, 62.7, and 63.2%, respectively.

However, in the document above, specific examples of a phosphor having a fluorescence peak wavelength of less than 592 nm and a phosphor of more than 600 nm, each having a luminous efficiency enough for practical use, are not illustrated.

Patent Document 4 discloses a SiAlON phosphor having a specific property of emitting light with high luminance compared with conventional phosphors, where a metal compound mixture capable of composing a SiAlON phosphor through firing is fired in a specific temperature range in a gas having a specific pressure, pulverized to a specific particle diameter, and then subjected to classification and a heat treatment.

However, the matter specifically disclosed in the document is only the peak luminous intensity and since the peak luminous intensity varies depending on the measuring apparatus and measurement conditions, it is not known whether a luminous intensity high enough for practice use is obtained. Out of the phosphors specifically disclosed in the document, a SiAlON phosphor having a highest-intensity wavelength (=fluorescence peak wavelength) of 573 nm at best is a phosphor having a longest wavelength.

RELATED ART

Patent Document

Patent Document 1: Kokai (Japanese Unexamined Patent Publication) No. 2002-363554
Patent Document 2: Kokai No. 2009-96882
Patent Document 3: Kokai No. 2009-96883
Patent Document 4: Kokai No. 2005-008794

SUMMARY OF THE INVENTION

Problems to be Solved by the Invention

A phosphor having a high luminance enough for practical use is demanded for the purpose of adjusting the color temperature of a white LED or obtaining yellow-orange luminescence of a desired wavelength, nevertheless, as described above, an α-SiAlON phosphor exhibiting a high efficiency enough for practical use and having a fluorescence peak wavelength in a broad emission peak wavelength of 595 to 605 nm is not known.

An object of the present invention is to provide an oxynitride phosphor having a fluorescence peak wavelength of 595 to 605 nm and preferably having an external quantum efficiency higher than ever before.

Another object of the present invention is to provide a silicon nitride powder for the production of oxynitride phosphor powder so as to provide the oxynitride phosphor above.

Still another object of the present invention is to provide a production method of an oxynitride phosphor so as to provide the oxynitride phosphor above.

Means to Solve the Problems

As a result of intensive studies to attain the objects above, the present inventors have found that when a silicon source, an aluminum source, a calcium source, and a europium source are mixed to give a composition represented by the compositional formula:

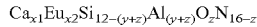

(wherein:
0<x1≤3.40,
0.05≤x2≤0.20,
4.0≤y≤7.0, and
0≤z≤1), and the mixture is fired to obtain a phosphor, where the phosphor is obtained as an oxynitride phosphor powder containing α-SiAlON and aluminum nitride, an oxynitride phosphor powder that emits fluorescence having a peak wavelength in a broad wavelength region of 595 to 605 nm by excitation with light having a wavelength of 450 nm and exhibits a good external quantum efficiency in light emission is obtained. The present invention has been accomplished based on this finding.

That is, the present invention relates to an oxynitride phosphor powder containing α-SiAlON and aluminum nitride, obtained by mixing a silicon source, an aluminum source, a calcium source, and a europium source to give a composition represented by the compositional formula:

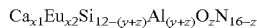

(wherein x1, x2, y and z are
0<x1≤3.40,
0.05≤x2≤0.20,
4.0≤y≤7.0, and
0≤z≤1),
and firing the mixture.

In particular, the present invention relates to the oxynitride phosphor powder, wherein in the compositional formula, x1, x2, y and z are:
0<x1≤3.40,
0.05≤x2≤0.20,
4.50≤y≤5.50, and
0≤z≤1.00.

Also, the present invention relates to the oxynitride phosphor powder, wherein in the compositional formula, x1, x2, y and z are:
1.37≤x1≤2.60,
0.16≤x2≤0.20,
4.50≤y≤5.50, and
0≤z≤0.30.

Also, the present invention relates to the oxynitride phosphor powder, wherein in the compositional formula, x1, x2, y and z are:
1.70<x1≤2.60,
0.16≤x2≤0.20,
4.50≤y≤5.05, and
0≤z≤0.30.

Also, the present invention relates to the oxynitride phosphor powder, wherein in the compositional formula, x1, x2, y and z are:
1.70<x1≤2.60,
0.16≤x2≤0.20,
4.50≤y≤5.05, and
0≤z≤0.10.

Also, the present invention relates to the oxynitride phosphor powder, wherein in the compositional formula, the content of aluminum nitride is from more than 0 mass % to less than 32 mass %.

Also, the present invention relates to the oxynitride phosphor powder, wherein the external quantum efficiency of fluorescence emitted by excitation with light having a wavelength of 450 nm is 60% or more.

Also, the present invention relates to the oxynitride phosphor powder containing α-SiAlON and aluminum nitride, wherein the light reflectance is 80% or more.

Also, the present invention relates to the oxynitride phosphor powder, wherein the lattice constant of the α-SiAlON crystal phase constituting the oxynitride phosphor powder is in the range of 7.93 Å≤a=b≤7.99 Å and 5.75 Å≤c≤5.80 Å.

Also, the present invention relates to the oxynitride phosphor powder, wherein the 50% diameter ($D_{50}$) in the particle size distribution curve measured by a laser diffraction/scattering particle size distribution measuring apparatus is from 10.0 to 20.0 μm and the specific surface area is from 0.2 to 0.6 m$^2$/g.

Also, the present invention relates to the oxynitride phosphor powder, wherein the amorphous layer on the particle surface is less than 2 nm.

Also, the present invention relates to the oxynitride phosphor powder, wherein fluorescence having a peak wavelength in the wavelength region of 595 to 605 nm is emitted by excitation with light having a wavelength of 450 nm and the external quantum efficiency in light emission is 60% or more.

Also, the present invention relates to the oxynitride phosphor powder, wherein x1, x2, y and z are:
1.37≤x1≤2.60,
0.16≤x2≤0.20,
4.50≤y≤5.50, and
0≤z≤0.30,
fluorescence having a peak wavelength in the wavelength region of 602 to 605 nm is emitted, and the external quantum efficiency in light emission is 60% or more.

In another aspect, the present invention relates to a silicon nitride powder for the production of oxynitride phosphor powder, which is a crystalline silicon nitride powder used as a raw material for producing the oxynitride phosphor powder above, wherein the oxygen content is from 0.2 to 0.9 mass %.

Also, the present invention relates to the silicon nitride powder for the production of oxynitride phosphor powder, wherein silicon nitride powder for the production of oxynitride phosphor powder has an average particle diameter of 1.0 to 12.0 μm.

Also, the present invention relates to the silicon nitride powder for the production of oxynitride phosphor powder, wherein silicon nitride powder for the production of oxynitride phosphor powder has a specific surface area of 0.2 to 3.0 m$^2$/g.

Also, the present invention relates to the silicon nitride powder for the production of oxynitride phosphor powder, which is a crystalline silicon nitride powder used as a raw material for producing the oxynitride phosphor powder wherein in the compositional formula, x1, x2, y and z are:

$1.37 \leq x1 \leq 2.60$, further $1.70 \leq x1 \leq 2.60$,
$0.16 \leq x2 \leq 0.20$,
$4.50 \leq y \leq 5.50$, and
$0 \leq z \leq 0.30$, further $0 \leq z \leq 0.10$.

In still another aspect, the present invention relates to a method for producing an oxynitride phosphor powder, comprising:

a first step of mixing a silicon source, an aluminum source, a calcium source, and a europium source to give a composition represented by the compositional formula:

$$Ca_{x1}Eu_{x2}Si_{12-(y+z)}Al_{(y+z)}O_zN_{16-z}$$

(wherein x1, x2, y and z:
$0 < x1 \leq 3.40$,
$0.05 \leq x2 \leq 0.20$,
$4.0 \leq y \leq 7.0$, and
$0 \leq z \leq 1$), and firing the mixture at a temperature of 1,500 to 2,000° C. in an inert gas atmosphere to obtain a fired oxynitride represented by the formula above, and a second step of heat-treating the fired oxynitride at a temperature of 1,100 to 1,600° C. in an inert gas atmosphere.

In this aspect, the present invention relates to the method for producing an oxynitride phosphor powder, wherein the silicon source is a silicon nitride powder and the silicon nitride powder has an oxygen content of 0.2 to 0.9 mass %, an average particle diameter of 1.0 to 12.0 μm, and a specific surface area of 0.2 to 3.0 m²/g.

Also, the present invention relates to the method for producing an oxynitride phosphor powder, which is a production method for the oxynitride phosphor powder wherein x1, x2, y and z are:
$1.37 \leq x1 \leq 2.60$,
$0.16 \leq x2 \leq 0.20$,
$4.50 \leq y \leq 5.50$, and
$0 \leq z \leq 0.30$.

Effects of the Invention

According to the present invention, a novel oxynitride phosphor powder which is a phosphor obtained by mixing a silicon source, an aluminum source, a calcium source, and a europium source to give an oxynitride phosphor having a composition represented by the compositional formula:

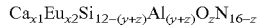
$$Ca_{x1}Eu_{x2}Si_{12-(y+z)}Al_{(y+z)}O_zN_{16-z}$$

wherein $0 < x1 \leq 3.40$, $0.05 \leq x2 \leq 0.20$, $4.0 \leq y \leq 7.0$ and $0 \leq z \leq 1$, and firing the mixture, where the phosphor is obtained as an oxynitride phosphor powder containing α-SiAlON and aluminum nitride and florescence having a peak wavelength in a broad wavelength region of 595 to 605 nm can be thereby emitted by excitation with light having a wavelength of 450 nm, is provided. This novel oxynitride phosphor powder is advantageously characterized in that the external quantum efficiency of fluorescence emitted by excitation with light having a wavelength of 450 nm is particularly high, and therefore, a high-efficiency oxynitride phosphor powder can be provided. Also, the present invention provides a silicon nitride powder suitably usable for the production of the oxynitride phosphor powder above, and a production method for the oxynitride phosphor powder.

BRIEF DESCRIPTION OF THE DRAWINGS

FIG. 1 is a view showing the powder X-ray diffraction pattern of Example 2.

FIG. 2 is a view showing the powder X-ray diffraction pattern of Example 8.

MODE FOR CARRYING OUT THE INVENTION

Figure 3:
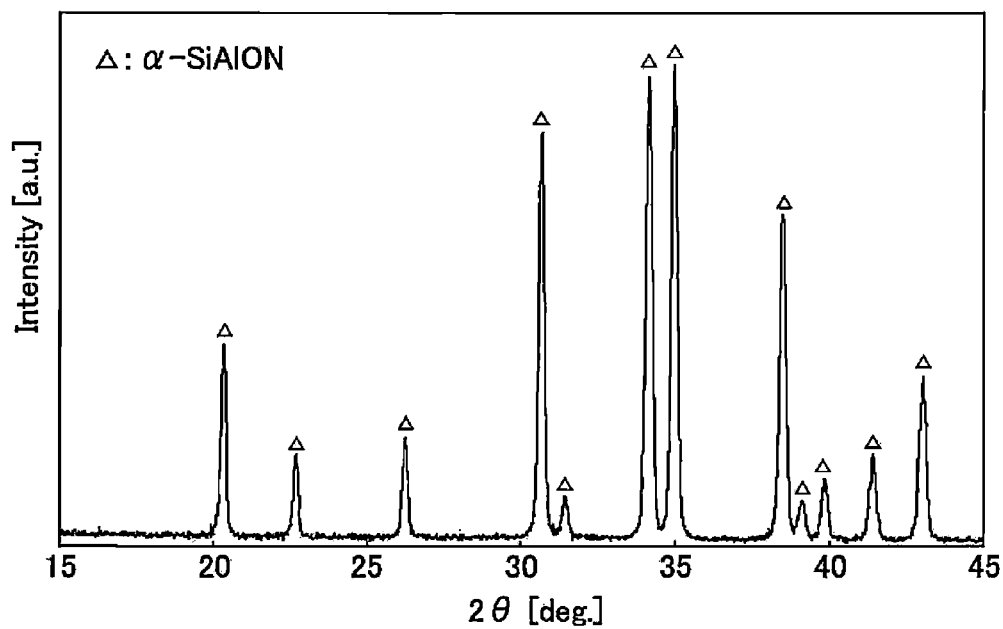
FIG. 3 is a view showing the powder X-ray diffraction pattern of Comparative Example 5.

The present invention is described in detail below.

The present invention relates to an oxynitride phosphor powder capable of emitting fluorescence having a peak wavelength in a broad wavelength region of 595 to 605 nm by excitation with light having a wavelength of 450 nm, which is obtained as an oxynitride phosphor powder containing an α-SiAlON and aluminum nitride by mixing a silicon source, an aluminum source, a calcium source, and a europium source to give an oxynitride phosphor having a composition represented by the compositional formula:

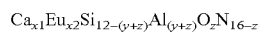
$$Ca_{x1}Eu_{x2}Si_{12-(y+z)}Al_{(y+z)}O_zN_{16-z}$$

wherein:
$0 < x1 \leq 3.40$,
$0.05 \leq x2 \leq 0.20$,
$4.0 \leq y \leq 7.0$, and
$0 \leq z \leq 1$, and firing the mixture. Among others, the present invention relates to an oxynitride phosphor powder exhibiting particularly a high external quantum efficiency in light emission.

The α-SiAlON, particularly, the Ca-containing α-SiAlON, is a solid solution where a part of Si—N bond of α-silicon nitride is replaced by Al—N bond and Al—O bond and Ca ion is dissolved interstitially in the lattice and is solid-dissolved, thereby keeping the electrical neutrality.

In the α-SiAlON phosphor contained in the oxynitride phosphor of the present invention, Eu ion is dissolved interstitially in the lattice and is solid-dissolved, in addition to the Ca ion, and the Ca-containing α-SiAlON is thereby activated to give a phosphor represented by the formula above, which emits yellow-orange fluorescence by excitation with blue light.

The α-SiAlON phosphor obtained by activating a general rare earth element is, as described in Patent Document 1, represented by $MeSi_{12-(m+n)}Al_{(m+n)}O_nN_{16-n}$, (wherein Me is Ca, Mg, Y, or one lanthanide metal or two or more lanthanide metals excluding La and Ce), and the metal Me is solid-dissolved in the range of, at the minimum, one per three large unit cells of α-SiAlON containing four mass weights of $(Si,Al)_3(N,O)_4$ to, at the maximum, one per one unit cell thereof. The solid solubility limit is generally, in case of divalent metal Me, $0.6 < m < 3.0$ and $0 \leq n < 1.5$ in the formula above and, in case of trivalent metal Me, $0.9 < m < 4.5$ and $0 \leq n < 1.5$. In a region except for these regions, single-phase α-SiAlON is not obtained. Accordingly, studies of the α-SiAlON phosphor are so far limited to the composition ranges above.

The present inventors have made intensive studies on the range outside the range where single-phase α-SiAlON is obtained in general, as a result, it has been found that in comparison with a phosphor in the above-described composition range where single-phase α-SiAlON is obtained, the luminous efficiency is remarkably enhanced as in the present invention in a composition region where single-phase α-SiAlON is not heretofore obtained.

The oxynitride phosphor powder of the present invention is specifically described below.

The oxynitride phosphor powder is an oxynitride phosphor powder containing α-SiAlON and aluminum nitride, obtained by mixing a silicon source, an aluminum source, a calcium source, and a europium source to give a composition represented by the compositional formula:

$$Ca_{x1}Eu_{x2}Si_{12-(y+z)}Al_{(y+z)}O_zN_{16-z}$$

wherein
$0<x1\leq3.40$,
$0.05\leq x2\leq0.20$,
$4.0\leq y\leq7.0$, and
$0\leq z\leq1$,
and firing the mixture.

x1 and x2 are values indicating the amounts of Ca ion and Eu ion dissolved interstitially in SiAlON, and if x2 is less than 0.05 or exceeds 0.20 or if x1 exceeds 3.40, an external quantum efficiency of 60% or more cannot be obtained. x1 is preferably 1.37 or more, more preferably more than 1.7. x2 is preferably 0.16 or more.

y is a value determined so as to keep the electrical neutrality at the time of a metal element forming a solid solution in SiAlON and is represented by $y=2(x1)+3(x2)$ in the oxynitride phosphor powder above. In the formula, the coefficient of 2 of x1 is a numerical value determined from the valence of Ca ion solid-dissolved in the Ca-containing α-SiAlON phosphor and the coefficient of 3 of x2 is a numerical value determined from the valence of Eu ion solid-dissolved in the Ca-containing α-SiAlON phosphor. Also, the oxynitride phosphor of the present invention contains α-SiAlON and aluminum nitride and therefore, y is a value related to the amount of aluminum nitride produced. That is, when the y value exceeds the composition region where single-phase α-SiAlON is obtained, aluminum nitride or other aluminum-containing oxynitrides are produced.

In the present invention, the ranges of y and z are $4.0\leq y\leq7.0$ and $0\leq z\leq1$. In the case of a composition where y and z are in these ranges, a high-efficient oxynitride phosphor powder having an external quantum efficiency of 60% or more can be provided.

If y exceeds 7.0, the amount of aluminum nitride crystal phase produced becomes excessively large and an external quantum efficiency of 60% or more cannot be obtained. Also, if y is less than 4.0, an external quantum efficiency of 60% or more cannot be obtained. Furthermore, z is a value related to the amount of oxygen solid-dissolved by replacement in α-SiAlON. If z exceeds 1, the emission peak wavelength becomes shorter than 595 nm. Furthermore, if $1\leq y<2.3$ and $0\leq z<1.5$ or if $2.3\leq y<4.0$ and $0\leq z<1$, an external quantum efficiency of 60% or more cannot be obtained. In addition, if $0\leq y<1.0$ and $0\leq z<1.5$, β-SiAlON is produced and an external quantum efficiency of 60% or more cannot be obtained.

In the present invention, x1, x2, y and z are, each independently, preferably $1.37\leq x1\leq3.40$, $1.37\leq x1\leq2.60$ or $1.70<x1\leq2.60$, $0.16\leq x2\leq0.20$, $4.0\leq y\leq5.5$, $4.5\leq y\leq5.5$, $4.0\leq y\leq5.05$ or $4.5\leq y\leq5.05$, and $0\leq z\leq1$, $0\leq z\leq0.30$ or $0\leq z\leq0.10$. Therefore, a composition having an arbitrary combination of x1, x2, y and z in these ranges is preferred. An oxynitride phosphor powder having a high external quantum efficiency is provided according to the composition where x1, x2, y and z are in the ranges above.

Also, in the present invention, y and z are preferably in the ranges of $4.6\leq y\leq5.5$ and $0\leq z\leq1$. In the case of a composition where y and z are in these ranges, an oxynitride phosphor powder having a higher external quantum efficiency is provided.

In one preferred oxynitride phosphor powder of the present invention, in the compositional formula above, x1, x2, y and z are:
$0<x1\leq3.40$,
$0.05\leq x2\leq0.20$,
$4.50\leq y\leq5.50$, and
$0\leq z\leq1.00$.

In another preferred oxynitride phosphor powder of the present invention, in the compositional formula above, x1, x2, y and z are:
$1.37\leq x1\leq2.60$,
$0.16\leq x2\leq0.20$,
$4.50\leq y\leq5.50$, and
$0\leq z\leq0.30$.

In still another preferred oxynitride phosphor powder of the present invention, in the compositional formula above, x1, x2, y and z are:
$1.37\leq x1\leq2.60$,
$0.16\leq x2\leq0.20$,
$4.50\leq y\leq5.05$, and
$0\leq z\leq0.10$.

In yet still another preferred oxynitride phosphor powder of the present invention, in the compositional formula above, x1, x2, y and z are preferably $1.70<x1\leq2.60$, $0.16\leq x2\leq0.20$, $4.50\leq y\leq5.05$ and $0\leq z\leq0.10$.

When crystal phases are identified by an X-ray diffractometer (XRD) using CuKα radiation, the oxynitride phosphor powder of the present invention is composed of an α-SiAlON crystal phase classified into a trigonal system and an aluminum nitride crystal phase classified into a hexagonal system. In the case of a single phase of α-SiAlON crystal phase, the external quantum efficiency is low, and if the content of an aluminum nitride crystal phase is too large, the external quantum efficiency decreases. As for the content of the aluminum nitride crystal phase contained in the oxynitride phosphor powder, this crystal phase is preferably contained in a ratio of more than 0 mass % to less than 32 mass %. In the case of containing the aluminum nitride crystal phase in this range, the external quantum efficiency becomes high. The content of the aluminum nitride crystal phase may be 0.1 mass % or more, 1 mass % or more, 2 mass % or more, 4 mass % or more, or 10 mass % or more, and 30 mass % or less, or 25 mass % or less.

It is preferred not to contain a crystal phase other than α-SiAlON and aluminum nitride. Other crystal phases that are likely to be contained include α-silicon nitride, silicon oxide, calcium oxide, aluminum oxynitride, aluminum oxide, and the like, and the content thereof is preferably 1 mass % or less.

The oxynitride phosphor powder of the present invention need not contain fluorine and the like as impurities, other than α-SiAlON and aluminum nitride. The amount of impurities, particularly fluorine, may be less than 30 ppm, 20 ppm or less, 10 ppm or less, or 1 ppm or less.

The lattice constants of the α-SiAlON crystal phase and the aluminum nitride crystal phase can be determined by XRD measurement. In the oxynitride phosphor powder of the present invention, the lattice constant of the α-SiAlON crystal phase constituting the powder is preferably:

7.93 Å≤a=b≤7.99 Å, and
5.75 Å≤c≤5.80 Å.

If the lattice constant of the α-SiAlON crystal phase is outside of this range, the external quantum efficiency decreases.

Furthermore, in the oxynitride phosphor powder of the present invention, the lattice constant of the α-SiAlON crystal phase constituting the powder is more preferably:

7.96 Å≤a=b≤7.99 Å, and
5.77 Å≤c≤5.80 Å.

When the lattice constant is in this range, the external quantum efficiency becomes higher.

In the oxynitride phosphor powder of the present invention, the lattice constant of the aluminum nitride crystal phase constituting the powder is preferably:

3.11 Å≤a=b≤3.12 Å, and
4.97 Å≤c≤4.99 Å.

When the lattice constant of the aluminum nitride crystal phase is in this range, the external quantum efficiency becomes higher.

Identification of crystal phase by XRD measurement, refinement of lattice constant, and quantification of crystal phase can be performed using an X-ray pattern analysis software. The analysis software includes PDXL produced by Rigaku Corporation, and the like. Incidentally, the XRD measurement and refinement of lattice constant of the oxynitride phosphor powder and the quantification of crystal phase by the Rietveld method were performed using X-ray diffractometer (Ultima IV Protectus) and analysis software (PDXL) produced by Rigaku Corporation.

The oxynitride phosphor powder of the present invention is characterized in that the peak wavelength of fluorescence emitted by excitation with light having a wavelength of 450 nm is from 595 to 605 nm, particularly from 602 to 605 nm, or from 603 to 605 nm, and is a long wavelength. Furthermore, the external quantum efficiency of fluorescence having the above-described long peak wavelength excited by light with a wavelength of 450 nm can be 60% or more, particularly 62% or more, or 64% or more, and therefore, the usefulness is evident. In one preferred embodiment of the present invention, the fluorescence emitted by excitation with light having a wavelength of 450 nm may have a peak wavelength of 602 to 605 nm, particularly from 603 to 605 nm, and at the same time, may have an external quantum efficiency of 63% or more.

Also, in the oxynitride phosphor powder of the present invention, the light reflectance (reflectance of light having a peak wavelength in the fluorescence spectrum of fluorescence emitted by excitation with light of 450 nm) may be 80% or more and furthermore, may be 81% or more, 83% or more, 84% or more, or 85% or more. This oxynitride phosphor powder having a high light reflectance is obtained by further heat-treating the produced oxynitride phosphor powder, and the heat-treated oxynitride phosphor powder is preferred, because the external quantum efficiency is remarkably enhanced.

The light reflectance can be measured using an ultraviolet/visible spectrophotometer or a spectrofluorophotometer. In the case of measuring the reflectance by using a spectrofluorophotometer, the effect of fluorescence can be eliminated, and measurement can be advantageously performed in a wide wavelength range. In the present invention, the reflectance was measured using a measuring apparatus fabricated by combining a spectrofluorophotometer (FP-6500, manufactured by JASCO) and an integrating sphere. Specifically, a synchronous scanning method of measuring the intensity of reflected light having the same wavelength as that of incident light was performed and by taking the reflectance of reflection reference (standard white plate) as 100%, the reflectance was obtained by measuring the reflectance of the sample powder as a relative reflectance to the standard white plate. The diffuse reflectance in the range of 300 to 800 nm was measured, and the reflectance at the peak wavelength in the fluorescence spectrum was determined.

In order to suitably use the oxynitride phosphor powder of the present invention as a phosphor for white LED, it is preferred that $D_{50}$ as the 50% diameter in the particle size distribution curve is from 10.0 to 20.0 μm and the specific surface area is from 0.2 to 0.6 m$^2$/g. Because, if $D_{50}$ is less than 10.0 μm or the specific surface area exceeds 0.6 m$^2$/g, the luminous intensity may be reduced, and if $D_{50}$ exceeds 20.0 μm or the specific surface area is less than 0.2 m$^2$/g, the powder may be hardly dispersed uniformly in the resin encapsulating the phosphor and variation sometimes occurs in the color tone of white LED.

As for the method to control the particle diameter and specific surface area of the oxynitride phosphor powder of the present invention, these can be controlled by controlling the particle diameter of the raw material silicon nitride powder. Use of a silicon nitride powder having an average particle diameter ($D_{50}$) of 1.5 μm or more is preferred, because $D_{50}$ of the oxynitride phosphor powder becomes 10 μm or more and at the same time, the specific surface area becomes from 0.2 to 0.6 m$^2$/g, leading to a higher external quantum efficiency.

$D_{50}$ of the oxynitride phosphor powder is a 50% diameter in the particle size distribution curve measured by a laser diffraction/scattering particle size distribution measuring apparatus. Also, the specific surface area of the oxynitride phosphor powder was measured by a specific surface area measuring apparatus, FlowSorb Model 2300, manufactured by Shimadzu Corporation (BET method by nitrogen gas adsorption).

It should be kept in mind that the above-described particle diameter and particle diameter distribution of the oxynitride phosphor powder of the present invention are those of a powder obtained by a so-called cracking treatment (a treatment where a primary particle is not substantially crushed and aggregation of particles is unraveled) for unraveling aggregation caused during firing, without crushing (applying a strong crushing force to) the oxynitride phosphor powder obtained by firing a mixture of raw materials. When a crushing treatment greater than cracking is performed, as is known, the particle surface is damaged and the fluorescent luminous efficiency is reduced.

Also, in the oxynitride phosphor powder of the present invention, the thickness of the amorphous layer on the particle surface is preferably less than 2 nm, more preferably 1 nm or less. When the thickness of the amorphous layer on the particle surface of the oxynitride phosphor is less than 2 nm, the external quantum efficiency is more increased.

In addition, the particle of the oxynitride phosphor powder of the present invention preferably has no grain boundary phase within the particle. When the particle of the oxynitride phosphor is composed of only an α-SiAlON crystal phase and an aluminum nitride crystal phase and does not have a grain boundary phase inside the particle, the external quantum efficiency is more increased.

The observation of internal structure of the particle and the measurement of thickness of the amorphous layer on the particle surface of the oxynitride phosphor of the present invention can be performed using a scanning transmission electron microscope STEM, JEM-2100F Cs corrector, manufactured by JEOL Ltd. (hereinafter referred to as STEM). In the present invention, the particle of the Ca-containing α-SiAlON phosphor is sliced by an Ar ion milling method, and the cross-section of the particle is observed by STEM at an accelerating voltage of 200 V.

The oxynitride phosphor powder of the present invention can emit fluorescence having a peak wavelength in the wavelength region of 595 to 605 nm, particularly from 602 to 605 nm, furthermore from 603 to 605 nm, by excitation with light in a wavelength region of 450 nm and at this time, can exhibit an external quantum efficiency of 60% or more, particularly 62% or more, 63% or more, or 64% or more. Thanks to these capabilities, in the oxynitride phosphor powder of the present invention, long-wavelength orange fluorescence can be efficiently obtained by blue excitation light, and furthermore, white light having a good color rendering property can be efficiently obtained by the combination with blue light used as excitation light.

The fluorescence peak wavelength can be measured using a solid quantum efficiency measuring apparatus fabricated by combining an integrating sphere with FP-6500 manufactured by JASCO. The fluorescence spectrum correction can be performed using a secondary standard light source. The fluorescence peak wavelength sometimes slightly varies depending on the measuring device or correction conditions.

Also, the external quantum efficiency can be determined by measuring the absorptivity and internal quantum efficiency by a solid quantum efficiency measuring apparatus fabricated by combining an integrating sphere with FP-6500 manufactured by JASCO, and calculating the product thereof.

The oxynitride phosphor powder of the present invention can be used as a light-emitting device for various lighting apparatuses by combining the powder with a known light-emitting source such as light-emitting diode.

In particular, a light-emitting source capable of emitting excitation light having a peak wavelength of 330 to 500 nm is suitable for the oxynitride phosphor powder of the present invention. The oxynitride phosphor powder exhibits a high luminous efficiency in the ultraviolet region and enables fabricating a light-emitting device having good performance. The luminous efficiency is high also in using a blue light source, and a light-emitting device giving a good natural white color or daylight color can be fabricated by the combination of yellow-orange fluorescence of the oxynitride phosphor powder of the present invention with blue excitation light.

The production method for the oxynitride phosphor powder of the present invention is specifically described below.

The oxynitride phosphor powder of the present invention is obtained by mixing a silicon source, a europium source, a calcium source, and an aluminum source to give a composition represented by the compositional formula:

$$Ca_{x1}Eu_{x2}Si_{12-(y+z)}Al_{(y+z)}O_zN_{16-z}$$

wherein
0<x1≤3.40,
0.05≤x2≤0.20,
4.0≤y≤7.0, and
0≤z≤1,
and firing the mixture at a temperature of 1,500 to 2,000° C. in an inert gas atmosphere. Preferably, the resulting fired product is further heat-treated at a temperature of 1,100 to 1,600° C. in an inert gas atmosphere.

The silicon source of the raw material is selected from nitride, oxynitride and oxide of silicon and a precursor substance capable of becoming an oxide of silicon by pyrolysis. Among others, crystalline silicon nitride is preferred, and by using crystalline silicon nitride, an oxynitride phosphor having a high external quantum efficiency can be obtained.

The europium source of the raw material is selected from nitride, oxynitride and oxide of europium and a precursor substance capable of becoming an oxide of europium by pyrolysis. A europium nitride (EuN) is preferred. By using EuN, z can be made more small, and a phosphor having a long peak wavelength can be obtained.

The calcium source of the raw material is selected from nitride, oxynitride and oxide of calcium and a precursor substance capable of becoming an oxide of calcium by pyrolysis. A calcium nitride ($Ca_3N_2$) is preferred. By using $Ca_3N_2$, z can be made more small, and a phosphor having a long peak wavelength can be obtained.

The aluminum source of the raw material includes aluminum oxide, metal aluminum and aluminum nitride, and these powders may be used individually or may be used in combination.

The average particle diameter of silicon nitride powder as a raw material for the production of the oxynitride phosphor of the present invention is preferably from 1.0 to 12.0 μm, more preferably from 3.0 to 12.0 μm. If the average particle diameter is less than 1.0 μm, the oxygen content tends to increase and the effect of fluorescent properties is reduced. If the average particle diameter exceeds 12.0 μm, production is difficult and this is not practical. Incidentally, the average particle diameter of silicon nitride powder was measured from a scanning electron micrograph of the silicon nitride powder. Specifically, a circle was drawn in the scanning electron micrograph, individual particles contacting with the circle were determined for a maximum circle inscribed in the particle, the diameter of the determined circle was taken as the diameter of the particle, and the average particle diameter of the powder was calculated by averaging the diameters of those particles. The number of particles measured was adjusted to become from about 50 to 150.

The specific surface area of silicon nitride powder is preferably from 0.2 to 3.0 m$^2$/g, more preferably from 0.2 to 1.0 m$^2$/g. It is difficult in view of production to reduce the specific surface area of crystalline silicon nitride powder to less than 0.2 m$^2$/g, and such a specific surface area is not practical and causes a problem in device fabrication. If the specific surface area exceeds 3 m$^2$/g, the effect of fluorescent properties is reduced. Therefore, the specific surface area is preferably from 0.2 to 3.0 m$^2$/g. Incidentally, the specific surface area was measured by a specific surface area measuring apparatus, FlowSorb Model 2300, manufactured by Shimadzu Corporation (BET method by nitrogen gas adsorption).

As the silicon nitride powder used for the production of the oxynitride phosphor of the present invention, a crystalline silicon nitride powder can be preferably used as described above, and an α-silicon nitride powder is preferred.

In one aspect of the present invention, as the silicon nitride powder used for the production of the oxynitride phosphor of the present invention, a crystalline silicon nitride powder and an α-silicon nitride powder, each having a small oxygen content, can be preferably used among others. The oxygen content of silicon nitride powder as a raw material of the conventional phosphor is from 1.0 to 2.0 mass %, and by using a silicon nitride powder having a small oxygen content of 0.2 to 0.9 mass % for the phosphor raw material according to the present invention, an oxynitride phosphor powder exhibiting a higher fluorescence intensity than the conventional α-SiAlON-based phosphor can be obtained. The oxygen content in the silicon nitride is preferably from 0.2 to 0.8 mass %, more preferably an oxygen amount of 0.2 to 0.4 mass %. It is difficult in view of production to reduce the oxygen amount to less than 0.2 mass %, and if the oxygen amount exceeds 0.9 mass %, the oxynitride phosphor powder of the present invention cannot show significant enhancement in the fluorescent properties. Incidentally, the oxygen contained was measured by an oxygen/nitrogen simultaneous analyzer manufactured by LECO.

The silicon nitride powder that can be preferably used for the production of the oxynitride phosphor powder of the present invention can be obtained by thermally decomposing a nitrogen-containing silane compound and/or an amorphous silicon nitride powder. The nitrogen-containing silane compound includes silicon diimide ($Si(NH)_2$), silicon tetraamide, silicon nitrogen imide, silicon chloroimide, and the like. These are produced by a known method, for example, a method of reacting a silicon halide such as silicon tetrachloride, silicon tetrabromide or silicon tetraiodide with ammonia in a gas phase, or a method of reacting the silicon halide above in a liquid form with liquid ammonia.

As for the amorphous silicon nitride powder, those produced by a known method, for example, a method of thermally decomposing the nitrogen-containing silane compound above at a temperature of 1,200 to 1,460° C. in a nitrogen or ammonia gas atmosphere, or a method of reacting a silicon halide such as silicon tetrachloride, silicon tetrabromide or silicon tetraiodide with ammonia at a high temperature, are used. The average particle diameter of the amorphous silicon nitride powder and nitrogen-containing silane compound is usually from 0.003 to 0.05 μm.

The nitrogen-containing silane compound and amorphous silicon nitride powder are readily hydrolyzed or oxidized and therefore, these raw material powders are weighed in an inert gas atmosphere. Also, the oxygen concentration in a nitrogen gas flowing into a heating furnace used for heating and decomposing the nitrogen-containing silane compound can be controlled in the range of 0 to 2.0 vol %. An amorphous silicon nitride powder having a low oxygen content is obtained by setting the oxygen concentration in the atmosphere during heating and decomposition of the nitrogen-containing silane compound, for example, to 100 ppm or less, preferably 10 ppm or less. As the oxygen content of the amorphous silicon nitride powder is lower, the oxygen content of the obtained crystalline silicon nitride particle decreases. Furthermore, the content of metal impurities mixed in the amorphous silicon nitride powder is reduced to 10 ppm or less by a known method where the material of reaction vessel and the rubbing state between powder and metal in a powder handling device are improved.

Figure 4:
FIG. 4 is a scanning electron micrograph showing the silicon nitride powder for the production of oxynitride phosphor powder of Example 21.

Subsequently, the nitrogen-containing silane compound and/or amorphous silicon nitride powder are fired at 1,300 to 1,700° C. in a nitrogen or ammonia gas atmosphere to obtain a crystalline silicon nitride powder. The particle diameter is controlled by controlling the firing conditions (temperature and temperature rise rate). In the present invention, in order to obtain a low-oxygen crystalline silicon nitride powder, oxygen that is simultaneously incorporated into the firing system in a nitrogen gas atmosphere when firing an amorphous silicon nitride powder from a nitrogen-containing silane compound need to be controlled. In order to obtain a crystalline silicon nitride powder having a large particle diameter, a slow temperature rise of 40° C./h or less is required when firing a crystalline silicon nitride powder from an amorphous silicon nitride powder. In the thus-obtained crystalline silicon nitride powder, as shown in FIG. 4, large primary particles are substantially in a monodisperse state, and an aggregated particle and a fused particle are scarcely formed. The obtained crystalline silicon nitride powder is a high-purity powder having a metal impurity content of 100 ppm or less. Also, a low-oxygen crystalline silicon nitride powder is obtained by subjecting the crystalline silicon nitride powder above to a chemical treatment such as acid washing. In this way, the silicon nitride powder for the production of oxynitride phosphor powder, having an oxygen amount of 0.2 to 0.9 mass % of the present invention can be obtained.

Also, the silicon nitride powder obtained in this way does not require strong pulverization, unlike silicon nitride produced by direct nitridation of metal silicon, and therefore, is characterized in that the impurity amount is as very small as 100 ppm or less. The amount of impurities (Al, Ca, Fe) contained in the crystalline silicon nitride powder of the present invention is kept at 100 ppm or less, preferably 20 ppm or less, and this is preferred because an oxynitride phosphor powder exhibiting a high external quantum efficiency is obtained.

The silicon nitride powder raw material having the above-described low oxygen content can be preferably used in general for the production of the oxynitride phosphor of the present invention. This silicon nitride powder is also useful for the oxynitride phosphor powder where in the compositional formula, x1, x2, y and z are $1.37 \leq x1 \leq 2.60$, $0.16 \leq x2 \leq 0.20$, $4.50 \leq y \leq 5.50$ and $0 \leq z \leq 0.30$. In this composition, it is preferred that the silicon nitride powder raw material has the above-described low oxygen content, the average particle diameter thereof is from 1.0 to 12.0 μm, furthermore from 3.0 to 12.0 μm, and the specific surface area thereof is from 0.2 to 3.0 m$^2$/g, furthermore from 0.2 to 1.0 m$^2$/g. When the oxygen content, average particle diameter and specific surface area of the silicon nitride powder raw material are in these ranges, the oxynitride phosphor obtained advantageously emits fluorescence where the peak wavelength of fluorescence emitted by excitation with light having a wavelength of 450 nm is in a wavelength region of 602 to 605 nm, and at this time, exhibits an external quantum efficiency of 60% or more.

In the firing, an Li-containing compound working as a sintering aid is preferably added for the purpose of accelerating the sintering and producing an α-SiAlON crystal phase at a lower temperature. The Li-containing compound used includes lithium oxide, lithium carbonate, metal lithium, and lithium nitride, and the powders of respective compounds may be used individually or in combination. Also, the amount of the Li-containing compound added is appropriately from 0.01 to 0.5 mol in terms of Li element, per mol of the fired oxynitride.

The method for mixing a silicon source, a europium source, a calcium source, and an aluminum source is not particularly limited, and a method known in itself, for example, a method of dry mixing the raw materials, and a method of wet mixing the raw materials in an inert solvent substantially incapable of reacting with each raw material component, and then removing the solvent, may be employed. As the mixing apparatus, a V-shaped mixer, a rocking mixer, a ball mill, a vibration mill, a medium stirring mill and the like may be suitably used.

A mixture of a silicon source, a europium source, a calcium source, and an aluminum source is fired at a temperature of 1,500 to 2,000° C. in an inert gas atmosphere, whereby a fired oxynitride represented by the compositional formula above can be obtained. If the temperature is less than 1,500° C., the production of α-SiAlON requires heating for a long time and this is not practical. If the temperature exceeds 2,000° C., silicon nitride and α-SiAlON are sublimated and decomposed to produce free silicon and therefore, an oxynitride phosphor powder exhibiting a high external quantum efficiency cannot be obtained. The heating furnace used for firing is not particularly limited as long as firing at 1,500 to 2,000° C. in an inert gas atmosphere can be performed. For example, a batch electric furnace by a high frequency induction heating system or resistance heating system, a rotary kiln, a fluidized firing furnace, and a pusher-type electric furnace can be used. As for the crucible filled with the mixture, a BN-made crucible, a silicon nitride-made crucible, a graphite-made crucible, and a silicon carbide-made crucible can be used. The fired oxynitride obtained by firing is a powder with little aggregation and good dispersibility.

In the present invention, the fired oxynitride obtained by the firing above is further heat-treated. By subjecting the fired oxynitride obtained to a heat treatment at a temperature of 1,100 to 1,600° C. in an inert gas atmosphere or a reducing gas atmosphere, an oxynitride phosphor powder exhibiting a high external quantum efficiency at the time of emitting fluorescence having a peak wavelength in a wavelength region of 595 to 605 nm by excitation with light having a wavelength of 450 nm can be obtained. In order to obtain an oxynitride phosphor powder exhibiting a higher external quantum efficiency, the heat treatment temperature is preferably from 1,500 to 1,600° C. If the heat treatment temperature is less than 1,100° C. or exceeds 1,600° C., the external quantum efficiency of the obtained oxynitride phosphor powder is reduced. The holding time at the maximum temperature in case of performing heat treatment is preferably 0.5 hours or more so as to obtain a particularly high external quantum efficiency. Even when the heat treatment is performed for more than 4 hours, the external quantum efficiency is little enhanced for the extension of time or is scarcely changed. Therefore, the holding time at the maximum temperature in case of performing heat treatment is preferably from 0.5 to 4 hours.

The heating furnace used for the heat treatment is not particularly limited as long as a heat treatment at 1,100 to 1,600° C. in an inert gas atmosphere or a reducing gas atmosphere can be performed. For example, a batch electric furnace by a high frequency induction heating system or resistance heating system, a rotary kiln, a fluidized firing furnace, and a pusher-type electric furnace can be used. As for the crucible filled with the mixture, a BN-made crucible, a silicon nitride-made crucible, a graphite-made crucible, a silicon carbide-made crucible, and an alumina-made crucible can be used.

By performing the heat treatment at 1,100 to 1,600° C. in an inert gas atmosphere or a reducing gas atmosphere, the fluorescence peak wavelength of the oxynitride phosphor powder of the present invention is shifted to the long wavelength side by approximately from 0.5 to 2.5 nm and at the same time, the external quantum efficiency and the luminous intensity at the fluorescence peak wavelength are enhanced.

The oxynitride phosphor powder of the present invention heat-treated in this way can have an improved external quantum efficiency. Also, the heat-treated oxynitride phosphor powder of the present invention can have a light reflectance of 80% or more, furthermore 83% or more, or 85% or more. The oxynitride phosphor powder having a high light reflectance can have an improved external quantum efficiency.

One preferred embodiment of the oxynitride phosphor powder of the present invention is a phosphor powder obtained by the above-described production method, more specifically, an oxynitride phosphor powder represented by the compositional formula:

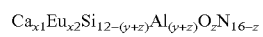

$$Ca_{x1}Eu_{x2}Si_{12-(y+z)}Al_{(y+z)}O_zN_{16-z}$$

wherein
 $0 < x1 \le 3.40$,
 $0.05 \le x2 \le 0.20$,
 $4.0 \le y \le 7.0$, and
 $0 \le z \le 1$,
which is obtained by mixing a silicon source, a europium source, a calcium source, an aluminum source, firing the mixture at a temperature of 1,500 to 2000° C. in an inert gas atmosphere, and subsequently heat-treating the fired product at a temperature of 1,100 to 1,600° C.

EXAMPLES

The present invention is described in greater detail below by referring to specific examples.

Example 1

Silicon nitride, europium nitride, aluminum nitride and calcium nitride were weighed to give the designed oxynitride composition of Table 1 in a glove box purged with nitrogen and mixed using a dry vibration mill to obtain a mixed powder. The specific surface area, average particle diameter and oxygen amount of the crystalline silicon nitride powder as the raw material were 0.3 m$^2$/g, 8.0 μm and 0.29 mass %, respectively. The resulting mixed powder was put in a silicon nitride-made crucible, and the crucible was charged into an electric furnace of a graphite resistance heating type. The temperature was raised to 1,725° C. while keeping the atmospheric pressure by flowing nitrogen into the electric furnace and held at 1,725° C. for 12 hours to obtain a fired oxynitride.

The resulting fired oxynitride was cracked and through classification, a powder having a particle diameter of 5 to 20 μm (oxynitride phosphor powder before heat treatment) was obtained. Thereafter, the obtained powder was put in an alumina crucible, and the crucible was charged into an electric furnace of a graphite resistance heating type. The temperature was raised to 1,600° C. while keeping the atmospheric pressure by flowing nitrogen into the electric furnace and held at 1,600° C. for 1 hour, and the resulting powder was cracked to obtain the oxynitride phosphor powder of the present invention (oxynitride phosphor powder after heat treatment; hereinafter, unless indicated to be before heat treatment, this powder is referred to as oxynitride phosphor powder).

$D_{50}$ of the obtained oxynitride phosphor powder was 13.2 μm, and the specific surface area was 0.33 m$^2$/g.

$D_{50}$ of the oxynitride phosphor powder of the present invention is a 50% diameter in the particle size distribution curve measured by a laser diffraction/scattering particle size distribution measuring apparatus. Also, the specific surface area of the oxynitride phosphor powder was measured using a specific surface area measuring apparatus, FlowSorb Model 2300, manufactured by Shimadzu Corporation according to the BET method by nitrogen gas adsorption.

Also, XRD measurement of the obtained oxynitride phosphor powder was performed. The oxynitride phosphor powder was composed of an α-SiAlON crystal phase and an aluminum nitride crystal phase, and their contents were 94 mass % and 6 mass %, respectively. The lattice constants of the α-SiAlON crystal phase and the aluminum nitride crystal phase were a=b=7.959 Å, c=5.775 Å, and a=b=3.113 Å, c=4.987 Å, respectively.

Furthermore, for evaluating the fluorescent properties of the obtained oxynitride phosphor powder (after heat treatment), the fluorescence spectrum at an excitation wavelength of 450 nm was measured and at the same time, the absorptivity and internal quantum efficiency were measured, by using a solid quantum efficiency measuring apparatus fabricated by combining an integrating sphere with FP-6500 manufactured by JASCO. The fluorescence peak wavelength and the luminous intensity at that wavelength were derived from the obtained fluorescence spectrum, and the external quantum efficiency was calculated from the absorptivity and the internal quantum efficiency. Also, the relative fluorescence intensity indicative of luminance was defined as the relative value of luminous intensity at the fluorescence peak wavelength when the value of highest intensity of the emission spectrum by the same excitation wavelength of a commercially available YAG:Ce-based phosphor (P46Y3 produced by Kasei Optonix, Ltd.) is taken as 100%. The evaluation results of fluorescent properties of the oxynitride phosphor powder according to Example 1 are shown in Table 1, and the produced crystal phase, its content, lattice constant, specific surface area and average particle diameter of the oxynitride phosphor powder are shown in Table 2.

Furthermore, fluorescent properties of the oxynitride phosphor powder before heat treatment were measured by the methods above, and the results obtained are shown in Table 1.

In addition, the light reflectance of the oxynitride phosphor powder before and after heat treatment was measured. The results are shown in Table 3.

<Evaluation Method of Light Reflectance>

The reflectance was measured using a measuring apparatus fabricated by combining a spectrofluorophotometer (FP-6500 manufactured by JASCO) and an integrating sphere. Specifically, a synchronous scanning method of measuring the intensity of reflected light having the same wavelength as that of incident light was performed and by taking the reflectance of reflection reference (standard white plate) as 100%, the light reflectance was obtained by measuring the reflectance of the sample powder as a relative reflectance to the standard white plate. The diffuse reflectance in the range of 300 to 800 nm was measured, and the reflectance of light at the peak wavelength in the fluorescence spectrum was determined.

Also, a particle of the obtained oxynitride phosphor powder was sliced by Ar ion milling, and the cross-section of the particle was observed by STEM. It was confirmed that a grain boundary was not present inside the particle. In addition, the region where a crystal lattice present on the particle surface was not observed was confirmed to be amorphous by an electron diffraction image. The thickness of this region was measured at 3 portions, as a result, the thickness of the amorphous region on the particle surface, that is, the thickness of the amorphous layer, was found to be less than 2 nm.

In this connection, the thickness of the amorphous layer on the particle surface was 1 nm or less in all Examples.

Examples 2 to 11

Oxynitride phosphor powders were obtained by the same method as in Example 1 except that raw material powders according to Examples 2 to 11 were weighed and mixed to give an oxynitride phosphor powder having the designed composition in Table 1. The fluorescent properties, average particle diameter, specific surface area, crystal phase produced, its content, and lattice content of each of the obtained oxynitride phosphor powders were measured by the same methods as in Example 1. The results are shown in Table 1 and Table 2. The specific surface area, average particle diameter and oxygen amount of the crystalline silicon nitride powder as the raw material were 0.3 $m^2/g$, 8.0 μm and 0.29 mass %, respectively. Also, FIGS. 1 and 2 show the powder X-ray diffraction patterns of Examples 2 and 8. It is seen from FIGS. 1 and 2 that the crystal phases produced were an α-SiAlON phase and an aluminum nitride phase.

As seen from Table 1, among others, the oxynitride phosphor powders of Examples 1 to 6 and 8 where in the formula above, $0<x1\leq3.40$, $0.05\leq x2\leq0.20$, $4.6\leq y\leq5.5$ and $0\leq z\leq1$ exhibit a high external quantum efficiency.

The results when the fluorescent properties of each oxynitride phosphor powder before heat treatment were measured in the same manner as in Example 1 are shown in Table 1, and the light reflectance of the oxynitride phosphor powder before and after the heat treatment is shown in Table 3.

Examples 12 and 13

Oxynitride phosphor powders were obtained by the same method as in Example 1 except that the specific surface area, average particle diameter and oxygen amount of the crystalline silicon nitride powder as the raw material were changed to 2.5 $m^2/g$, 1.5 μm and 0.53 mass % in Example 12 and to 10.0 $m^2/g$, 0.2 μm and 0.89 mass % in Example 13. The fluorescent properties, average particle diameter, specific surface area, crystal phase produced, its content, and lattice content of each of the obtained oxynitride phosphor powders were measured by the same methods as in Example 1. The results are shown in Table 1 and Table 2. Compared with Example 13 where the specific surface area and the average particle diameter of the oxynitride phosphor powder were 1.20 $m^2/g$ and 8.9μ, the external quantum efficiency was increased in Examples 1 and 12 where the specific surface area of the oxynitride phosphor powder was from 0.2 to 0.6 $m^2/g$ and the average particle diameter was from 10.0 to 20.0 μm.

Comparative Examples 1 to 13

Oxynitride phosphor powders were obtained by the same method as in Example 1 except that raw material powders according to Comparative Examples 1 to 13 were weighed and mixed to give an oxynitride phosphor powder having the designed composition in Table 1. The fluorescent properties, average particle diameter, specific surface area, crystal phase produced, its content, and lattice content of each of the obtained oxynitride phosphor powders were measured by the same methods as in Example 1. The results are shown in Table 1 and Table 2. Also, FIG. 3 shows the powder X-ray diffraction pattern of Comparative Example 5. It is seen from FIG. 3 that the crystal phase produced was only an α-SiAlON phase.

The results when the fluorescent properties of the oxynitride phosphor powder before heat treatment were measured in the same manner as in Example 1 are shown in Table 1, and the light reflectance of the oxynitride phosphor powder before and after the heat treatment is shown in Table 3.

TABLE 1

|  | | | | Silicon Nitride Powder (Raw Material) | | | Peak Wavelength [nm] | | Relative Fluorescence Intensity [%] | |
| --- | --- | --- | --- | --- | --- | --- | --- | --- | --- | --- |
|  | X1 | X2 | y | z | Specific Surface Area ($m^2$/g) | Average Particle Diameter (μm) | Oxygen Amount (mass %) | Before Heat Treatment | After Heat Treatment | Before Heat Treatment | After Heat Treatment |
| Example 1 | 2.15 | 0.100 | 4.6 | 0.0 | 0.3 | 8.0 | 0.29 | 601 | 603 | 114 | 207 |
| Example 2 | 2.00 | 0.200 | 4.6 | 0.0 | 0.3 | 8.0 | 0.29 | 602 | 604 | 117 | 212 |
| Example 3 | 2.15 | 0.100 | 4.6 | 0.5 | 0.3 | 8.0 | 0.29 | 599 | 601 | 113 | 206 |
| Example 4 | 2.00 | 0.200 | 4.6 | 0.5 | 0.3 | 8.0 | 0.29 | 600 | 602 | 116 | 210 |
| Example 5 | 2.15 | 0.100 | 4.6 | 1.0 | 0.3 | 8.0 | 0.29 | 597 | 599 | 113 | 206 |
| Example 6 | 2.00 | 0.200 | 4.6 | 1.0 | 0.3 | 8.0 | 0.29 | 598 | 600 | 116 | 210 |
| Example 7 | 1.85 | 0.100 | 4.0 | 0.5 | 0.3 | 8.0 | 0.29 | 597 | 599 | 113 | 205 |
| Example 8 | 2.60 | 0.100 | 5.5 | 0.5 | 0.3 | 8.0 | 0.29 | 600 | 602 | 117 | 212 |
| Example 9 | 2.85 | 0.100 | 6.0 | 0.5 | 0.3 | 8.0 | 0.29 | 602 | 604 | 108 | 196 |
| Example 10 | 3.10 | 0.100 | 6.5 | 0.5 | 0.3 | 8.0 | 0.29 | 602 | 604 | 107 | 203 |
| Example 11 | 3.35 | 0.100 | 7.0 | 0.5 | 0.3 | 8.0 | 0.29 | 603 | 605 | 107 | 194 |
| Example 12 | 2.15 | 0.100 | 4.6 | 0.0 | 2.5 | 1.5 | 0.53 |  | 604 |  | 198 |
| Example 13 | 2.15 | 0.100 | 4.6 | 0.0 | 10.0 | 0.2 | 0.89 |  | 604 |  | 195 |
| Com. Ex. 1 | 0.48 | 0.015 | 1.0 | 0.3 | 0.3 | 8.0 | 0.29 | 587 | 587 | 127 | 175 |
| Com. Ex. 2 | 0.98 | 0.015 | 2.0 | 0.3 | 0.3 | 8.0 | 0.29 | 598 | 598 | 133 | 175 |
| Com. Ex. 3 | 1.38 | 0.015 | 2.8 | 0.3 | 0.3 | 8.0 | 0.29 | 601 | 601 | 134 | 185 |
| Com. Ex. 4 | 0.23 | 0.015 | 0.5 | 0.5 | 0.3 | 8.0 | 0.29 | 582 | 582 | 99 | 128 |
| Com. Ex. 5 | 0.41 | 0.060 | 1.0 | 1.0 | 0.3 | 8.0 | 0.29 | 599 | 599 | 132 | 181 |
| Com. Ex. 6 | 0.70 | 0.015 | 1.5 | 1.0 | 0.3 | 8.0 | 0.29 | 582 | 582 | 133 | 176 |
| Com. Ex. 7 | 0.98 | 0.015 | 2.0 | 1.0 | 0.3 | 8.0 | 0.29 | 589 | 589 | 138 | 183 |
| Com. Ex. 8 | 1.23 | 0.015 | 2.5 | 1.0 | 0.3 | 8.0 | 0.29 | 593 | 593 | 135 | 187 |
| Com. Ex. 9 | 0.48 | 0.015 | 1.0 | 4.0 | 0.3 | 8.0 | 0.29 | 586 | 586 | 88 | 110 |
| Com. Ex. 10 | 1.23 | 0.015 | 2.5 | 3.0 | 0.3 | 8.0 | 0.29 | 589 | 589 | 88 | 111 |
| Com. Ex. 11 | 1.98 | 0.015 | 4.0 | 3.0 | 0.3 | 8.0 | 0.29 | 593 | 593 | 96 | 123 |
| Com. Ex. 12 | 2.98 | 0.015 | 6.0 | 1.5 | 0.3 | 8.0 | 0.29 | 599 | 599 | 98 | 134 |
| Com. Ex. 13 | 3.73 | 0.015 | 7.5 | 0.0 | 0.3 | 8.0 | 0.29 | 603 | 603 | 96 | 132 |

|  | Absorptivity [%] | | Internal Quantum Efficiency [%] | | External Quantum Efficiency [%] | | Percentage Increase in External Quantum Efficiency by Heat Treatment [%] |
| --- | --- | --- | --- | --- | --- | --- | --- |
|  | Before Heat Treatment | After Heat Treatment | Before Heat Treatment | After Heat Treatment | Before Heat Treatment | After Heat Treatment |  |
| Example 1 | 80.4 | 82.0 | 42.5 | 77.6 | 34.2 | 63.6 | 186.3 |
| Example 2 | 85.5 | 87.2 | 41.0 | 74.7 | 35.1 | 65.1 | 185.8 |
| Example 3 | 81.8 | 83.5 | 41.6 | 75.9 | 34.0 | 63.4 | 186.3 |
| Example 4 | 83.9 | 85.6 | 41.4 | 75.5 | 34.8 | 64.6 | 185.9 |
| Example 5 | 81.2 | 82.9 | 41.9 | 76.5 | 34.0 | 63.4 | 186.3 |
| Example 6 | 84.9 | 86.6 | 41.0 | 74.7 | 34.8 | 64.7 | 185.9 |
| Example 7 | 77.7 | 79.3 | 43.5 | 79.5 | 33.8 | 63.0 | 186.5 |
| Example 8 | 81.8 | 83.5 | 43.0 | 78.2 | 35.2 | 65.3 | 185.7 |
| Example 9 | 82.2 | 83.9 | 39.1 | 71.9 | 32.2 | 60.3 | 187.5 |
| Example 10 | 82.5 | 84.2 | 39.0 | 71.6 | 32.2 | 60.3 | 187.5 |
| Example 11 | 82.4 | 84.1 | 38.8 | 71.3 | 32.0 | 60.0 | 187.6 |
| Example 12 |  | 82.0 |  | 74.3 |  | 60.9 |  |
| Example 13 |  | 81.9 |  | 73.2 |  | 60.0 |  |
| Com. Ex. 1 | 70.3 | 70.5 | 59.8 | 76.2 | 42.0 | 53.7 | 128.0 |
| Com. Ex. 2 | 71.0 | 71.3 | 61.4 | 75.5 | 43.6 | 53.8 | 123.4 |
| Com. Ex. 3 | 72.5 | 72.8 | 60.8 | 78.4 | 44.1 | 57.1 | 129.4 |
| Com. Ex. 4 | 64.0 | 64.2 | 51.5 | 60.8 | 32.9 | 39.0 | 118.5 |
| Com. Ex. 5 | 83.7 | 84.0 | 51.7 | 66.5 | 43.3 | 55.8 | 128.9 |
| Com. Ex. 6 | 72.1 | 72.4 | 60.8 | 74.8 | 43.8 | 54.2 | 123.5 |
| Com. Ex. 7 | 73.5 | 73.8 | 61.5 | 76.4 | 45.2 | 56.4 | 124.6 |
| Com. Ex. 8 | 74.1 | 74.4 | 59.9 | 77.3 | 44.4 | 57.5 | 129.6 |
| Com. Ex. 9 | 67.1 | 67.4 | 43.9 | 50.3 | 29.5 | 33.9 | 115.1 |
| Com. Ex. 10 | 68.3 | 68.6 | 43.3 | 49.7 | 29.6 | 34.1 | 115.3 |
| Com. Ex. 11 | 70.2 | 70.5 | 45.6 | 53.8 | 32.0 | 37.9 | 118.5 |
| Com. Ex. 12 | 74.5 | 74.8 | 43.7 | 55.3 | 32.6 | 41.4 | 126.9 |
| Com. Ex. 13 | 76.5 | 76.8 | 42.0 | 52.9 | 32.1 | 40.6 | 126.5 |

Com. Ex.: Comparative Example

TABLE 2

| | Crystal Phase | Content of Crystal Phase [wt %] | | | Lattice Constant of α-SiAlON | | Lattice Constant of AlN | | Specific Surface Area [m²/g] | Average Particle Diameter [μm] |
|---|---|---|---|---|---|---|---|---|---|---|
| | | α-SiAlON | AlN | AlON | a [Å] | c [Å] | a [Å] | c [Å] | | |
| Example 1 | α-SiAlON + AlN | 94 | 6 | — | 7.959 | 5.775 | 3.113 | 4.987 | 0.33 | 13.2 |
| Example 2 | α-SiAlON + AlN | 93 | 7 | — | 7.964 | 5.776 | 3.115 | 4.989 | 0.34 | 12.8 |
| Example 3 | α-SiAlON + AlN | 91 | 9 | — | 7.973 | 5.789 | 3.115 | 4.976 | 0.31 | 14.1 |
| Example 4 | α-SiAlON + AlN | 89 | 11 | — | 7.970 | 5.787 | 3.118 | 4.977 | 0.30 | 14.6 |
| Example 5 | α-SiAlON + AlN | 87 | 13 | — | 7.984 | 5.795 | 3.119 | 4.972 | 0.33 | 13.2 |
| Example 6 | α-SiAlON + AlN | 86 | 14 | — | 7.986 | 5.794 | 3.120 | 4.971 | 0.32 | 13.7 |
| Example 7 | α-SiAlON + AlN | 98 | 2 | — | 7.935 | 5.751 | 3.111 | 4.974 | 0.29 | 15.1 |
| Example 8 | α-SiAlON + AlN | 76 | 24 | — | 7.983 | 5.796 | 3.119 | 4.987 | 0.27 | 16.2 |
| Example 9 | α-SiAlON + AlN | 72 | 28 | — | 7.985 | 5.797 | 3.120 | 4.987 | 0.29 | 16.0 |
| Example 10 | α-SiAlON + AlN | 70 | 30 | — | 7.986 | 5.798 | 3.120 | 4.989 | 0.28 | 15.7 |
| Example 11 | α-SiAlON + AlN | 69 | 31 | — | 7.987 | 5.799 | 3.120 | 4.989 | 0.28 | 15.9 |
| Example 12 | α-SiAlON + AlN | 96 | 4 | — | 7.959 | 5.775 | 3.113 | 4.987 | 0.59 | 10.2 |
| Example 13 | α-SiAlON + AlN | 94 | 6 | — | 7.959 | 5.775 | 3.113 | 4.987 | 1.20 | 8.9 |
| Com. Ex. 1 | α-SiAlON | 100 | — | — | 7.806 | 5.677 | — | — | 0.39 | 11.2 |
| Com. Ex. 2 | α-SiAlON | 100 | — | — | 7.827 | 5.693 | — | — | 0.37 | 11.8 |
| Com. Ex. 3 | α-SiAlON | 100 | — | — | 7.876 | 5.728 | — | — | 0.33 | 13.2 |
| Com. Ex. 4 | α-SiAlON + β-SiAlON | 72** | — | — | 7.772 | 5.646 | — | — | 0.31 | 13.8 |
| Com. Ex. 5 | α-SiAlON | 100 | — | — | 7.817 | 5.685 | — | — | 0.36 | 11.6 |
| Com. Ex. 6 | α-SiAlON | 100 | — | — | 7.818 | 5.686 | — | — | 0.31 | 14.1 |
| Com. Ex. 7 | α-SiAlON | 100 | — | — | 7.839 | 5.699 | — | — | 0.29 | 15.1 |
| Com. Ex. 8 | α-SiAlON | 100 | — | — | 7.845 | 5.706 | — | — | 0.31 | 14.1 |
| Com. Ex. 9 | α-SiAlON + AlN + AlON | 67 | 15 | 18 | 7.896 | 5.743 | 3.101 | 4.796 | 0.37 | 12.8 |
| Com. Ex. 10 | α-SiAlON + AlN | 85 | 15 | — | 7.892 | 5.741 | 3.089 | 4.853 | 0.28 | 16.6 |
| Com. Ex. 11 | α-SiAlON + AlN | 68 | 32 | — | 7.971 | 5.801 | 3.122 | 4.997 | 0.32 | 13.7 |
| Com. Ex. 12 | α-SiAlON + AlN | 65 | 35 | — | 7.992 | 5.806 | 3.126 | 4.997 | 0.27 | 16.2 |
| Com. Ex. 13 | α-SiAlON + AlN | 57 | 43 | — | 7.999 | 5.809 | 3.129 | 4.994 | 0.27 | 16.2 |

Com. Ex.: Comparative Example
* Aluminum oxynitride crystal phase ($Al_{2.81}O_{3.56}N_{0.44}$)
**Containing 28 wt % of β-SiAlON crystal phase

TABLE 3

Reflectance Before and After Heat Treatment

| | Reflectance After Heat Treatment [%] | Reflectance Before Heat Treatment [%] |
|---|---|---|
| Example 1 | 86.3 | 75.4 |
| Example 2 | 83.9 | 75.9 |
| Example 3 | 84.9 | 75.3 |
| Example 4 | 84.6 | 75.7 |
| Example 5 | 85.4 | 75.4 |
| Example 6 | 83.9 | 75.8 |
| Example 7 | 87.9 | 75.2 |
| Example 8 | 86.8 | 76.0 |
| Example 9 | 81.6 | 74.4 |
| Example 10 | 81.4 | 74.4 |
| Example 11 | 81.1 | 74.3 |

Example 21

First, a crystalline silicon nitride powder for the production of oxynitride phosphor powder of the present invention was produced. The method therefor is as follows.

A toluene solution having a silicon tetrachloride concentration of 50 vol % was reacted with a liquid ammonia to produce silicon diimide having a powder bulk density (apparent density) of 0.13 g/cm³, and the silicon diimide was heated and decomposed at 1,150° C. in a nitrogen gas atmosphere to obtain an amorphous silicon nitride powder having a powder bulk density (apparent density) of 0.25 g/cm³. Incidentally, in the operation of heating and decomposing silicon diimide, a nitrogen gas was introduced to a heating furnace used for the operation such that the oxygen concentration in the nitrogen gas flowing into the heating furnace became 0.0005 vol % or less. The content of metal impurities mixed in the obtained amorphous silicon nitride powder was reduced to 10 ppm or less by a known method where the material of reaction vessel and the rubbing state between powder and metal in a powder handling device are improved.

The obtained amorphous silicon nitride powder was put in a carbon-made crucible and fired under the following temperature conditions in a nitrogen gas atmosphere by using a heating furnace to obtain a crystalline silicon nitride powder. The temperature was raised from room temperature to 1,100° C. over 1 hour, the temperature rise rate from 1,100° C. to 1,400° C. was set to 10° C./h, the temperature was raised from 1,400° C. to 1,500° C. over 1 hour, and the temperature was kept at 1,500° C. for 1 hour. The obtained crystalline silicon nitride powder was subjected to a cracking treatment and then evaluated for the following properties.

FIG. 4 shows a scanning electron micrograph of the obtained crystalline silicon nitride powder. The specific surface area was 0.3 m²/g, the average particle diameter was 8.0 μm, and the oxygen amount was 0.29 mass %.

The specific surface area of the crystalline silicon nitride powder was measured using a specific surface area measuring apparatus, FlowSorb Model 2300, manufactured by Shimadzu Corporation according to the BET method by nitrogen gas adsorption. The oxygen content of the crystalline silicon nitride powder was measured by an oxygen/nitrogen simultaneous analyzer manufactured by LECO. The average particle diameter of the crystalline silicon nitride powder was measured from a scanning electron micrograph of the crystalline silicon nitride powder. Specifically, a circle was drawn in the scanning electron micrograph, about 150 individual particles contacting with the circle were determined for a maximum circle inscribed in the particle, the diameter of the determined circle was taken as the diameter of the particle, and the average particle diameter of the powder was calculated by averaging the diameters of those particles.

An impurity analysis by fluorescence X-ray was performed, as a result, the amount of impurities was very small, that is, Al was 0 ppm, Ca was 16 ppm, and Fe was 16 ppm.

This crystalline silicon nitride powder, europium nitride, aluminum nitride and calcium nitride were weighed to give the designed composition of oxynitride phosphor powder of Table 4 in a glove box purged with nitrogen and mixed using a dry vibration mill to obtain a mixed powder. The resulting mixed powder was put in a silicon nitride-made crucible, and the crucible was charged into an electric furnace of a graphite resistance heating type. The temperature was raised to 1,725° C. while keeping the atmospheric pressure by flowing nitrogen into the electric furnace and held at 1,725° C. for 12 hours to obtain a fired oxynitride.

The resulting fired oxynitride was cracked and through classification, a powder having a particle diameter of 5 to 20 μm was obtained. Thereafter, the obtained powder was put in an alumina crucible, and the crucible was charged into an electric furnace of a graphite resistance heating type. The temperature was raised to 1,600° C. while keeping the atmospheric pressure by flowing nitrogen into the electric furnace and held at 1,600° C. for 1 hour to obtain the oxynitride phosphor powder of the present invention.

Figure 5:
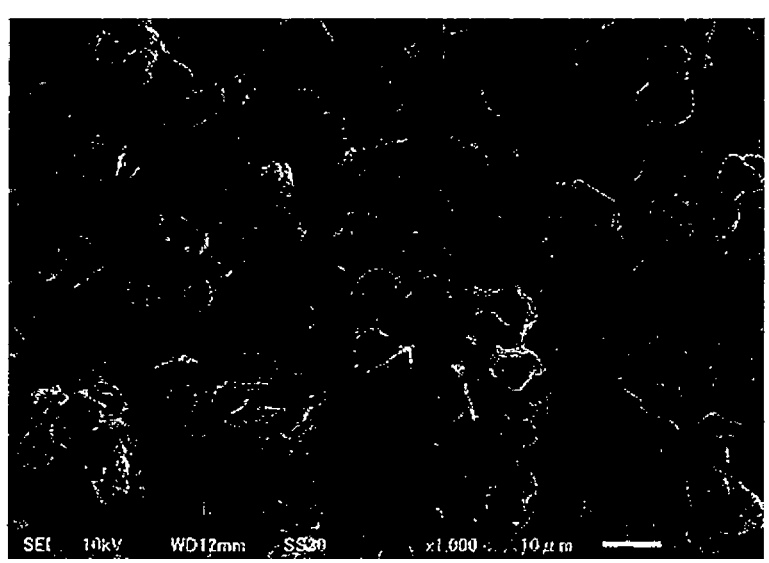
FIG. 5 is a scanning electron micrograph showing an oxynitride phosphor powder produced using the silicon nitride powder for the production of oxynitride phosphor powder of Example 21.

FIG. 5 shows a scanning electron micrograph of the obtained oxynitride phosphor powder. D50 was 15.2 μm, and the specific surface area was 0.29 $m^2/g$.

D50 of the oxynitride phosphor powder of the present invention is a 50% diameter in the particle size distribution curve measured by a laser diffraction/scattering particle size distribution measuring apparatus and was measured using LA-910 manufactured by Horiba Ltd. Also, the specific surface area of the oxynitride phosphor powder was measured using a specific surface area measuring apparatus, FlowSorb Model 2300, manufactured by Shimadzu Corporation according to the BET method by nitrogen gas adsorption, similarly to the crystalline silicon nitride powder.

Figure 6:
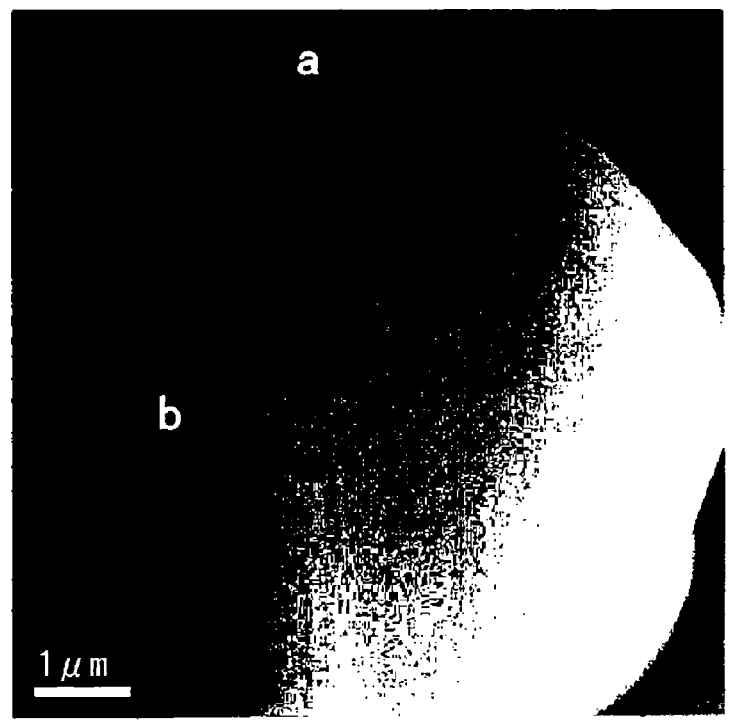
FIG. 6 is a scanning transmission electron micrograph showing the cross-section of a particle of an oxynitride phosphor powder produced using the silicon nitride powder for the production of oxynitride phosphor powder of Example 21.
Figure 7:
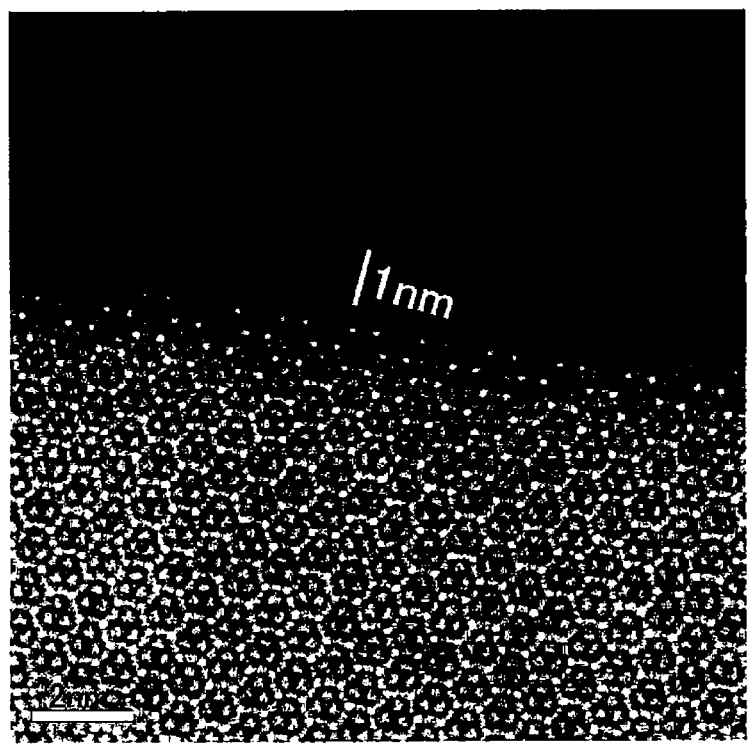
FIG. 7 is a scanning transmission electron micrograph showing the visual field a near the surface in the cross-section of a particle of an oxynitride phosphor powder shown in FIG. 6.

Also, a particle of the obtained oxynitride phosphor powder was sliced by Ar ion milling, and the cross-section of the particle was observed by STEM. FIG. 6 and FIG. 7 each shows an STEM photograph of the cross-section of the oxynitride phosphor powder particle. It is seen that a grain boundary is not present inside the particle. In addition, the region where a crystal lattice present on the particle surface was not observed was confirmed to be amorphous by an electron diffraction image. The thickness of this region was measured at 3 portions, as a result, the thickness of the amorphous region on the particle surface, that is, the thickness of the amorphous layer, was found to be 1 nm.

Furthermore, for evaluating the fluorescent properties of the obtained oxynitride phosphor powder, the excitation spectrum at a detection wavelength of 602 to 605 nm and the fluorescence spectrum at an excitation wavelength of 450 nm were measured and at the same time, the absorptivity and internal quantum efficiency were measured, by using a solid quantum efficiency measuring apparatus fabricated by combining an integrating sphere with FP-6500 manufactured by JASCO. The fluorescence peak wavelength and the luminous intensity at that wavelength were derived from the obtained fluorescence spectrum, and the external quantum efficiency was calculated from the absorptivity and the internal quantum efficiency. Also, the relative fluorescence intensity indicative of luminance was defined as the relative value of luminous intensity at the fluorescence peak wavelength when the value of highest intensity of the emission spectrum by the same excitation wavelength of a commercially available YAG:Ce-based phosphor (P46Y3 produced by Kasei Optonix, Ltd.) is taken as 100%. The evaluation results of fluorescent properties of the oxynitride phosphor powder according to Example 21 are shown in Table 4 together with the measurement results of oxygen amount, average particle diameter and specific surface area of the crystalline silicon nitride powder as the raw material of the oxynitride phosphor powder and the measurement results of D50 and specific surface area of the oxynitride phosphor powder.

Example 22

A crystalline silicon nitride powder was produced by the same method as in Example 1 except that at the time of heating and decomposing silicon diimide to obtain an amorphous silicon nitride powder, the nitrogen gas was introduced to the heating furnace to keep the oxygen concentration in the nitrogen gas flowing into the heating furnace at 0.6 vol %. The specific surface area of the obtained crystalline silicon nitride powder was 0.3 $m^2/g$, the average particle diameter was 8.0 μm, and the oxygen amount was 0.75 mass %.

An oxynitride phosphor powder was obtained by the same method as in Example 21 except that raw material powders containing the crystalline silicon nitride powder according to Example 22 were weighed and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of the oxynitride phosphor powder according to Example 22 and the measurement results of D50 and specific surface area of the oxynitride phosphor powder.

Example 23

A crystalline silicon nitride powder was produced by the same method as in Example 1 except that at the time of heating and decomposing silicon diimide to obtain an amorphous silicon nitride powder, the nitrogen gas was introduced to the heating furnace to keep the oxygen concentration in the nitrogen gas flowing into the heating furnace at 0.0006 vol % or less and at the time of firing the amorphous silicon nitride, the temperature rise rate from 1,100° C. to 1,400° C. was changed to 20° C./h. In this case, the specific surface area was 1.0 $m^2/g$, the average particle diameter was 3.0 μm, and the oxygen amount was 0.34 mass %.

An oxynitride phosphor powder was obtained by the same method as in Example 21 except that raw material powders containing the crystalline silicon nitride powder according to Example 23 were weighed and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of the oxynitride phosphor powder according to Example 23 and the measurement results of D50 and specific surface area of the oxynitride phosphor powder.

Example 24

A crystalline silicon nitride powder was produced by the same method as in Example 23 except that at the time of heating and decomposing silicon diimide to obtain an amorphous silicon nitride powder, the nitrogen gas was introduced to the heating furnace to keep the oxygen concentration in the nitrogen gas flowing into the heating furnace at 0.5 vol % or less. The specific surface area of the obtained crystalline silicon nitride was 1.0 m$^2$/g, the average particle diameter was 3.0 μm, and the oxygen amount was 0.72 mass %.

An oxynitride phosphor powder was obtained by the same method as in Example 21 except that raw material powders containing the crystalline silicon nitride powder according to Example 24 were weighed and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of the oxynitride phosphor powder according to Example 24 and the measurement results of D50 and specific surface area of the oxynitride phosphor powder.

Example 25

A crystalline silicon nitride powder was produced by the same method as in Example 21 except that at the time of heating and decomposing silicon diimide to obtain an amorphous silicon nitride powder, the nitrogen gas was introduced to the heating furnace to keep the oxygen concentration in the nitrogen gas flowing into the heating furnace at 0.0006 vol % or less and at the time of firing the amorphous silicon nitride, the temperature rise rate from 1,100° C. to 1,400° C. was changed to 35° C./h. The specific surface area was 2.5 m$^2$/g, the average particle diameter was 1.5 μm, and the oxygen amount was 0.53 mass %.

An oxynitride phosphor powder was obtained by the same method as in Example 21 except that raw material powders containing the crystalline silicon nitride powder according to Example 25 were weighed and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of the oxynitride phosphor powder according to Example 25 and the measurement results of D50 and specific surface area of the oxynitride phosphor powder.

Example 26

A crystalline silicon nitride powder was produced by the same method as in Example 25 except that at the time of heating and decomposing silicon diimide to obtain an amorphous silicon nitride powder, the nitrogen gas was introduced to the heating furnace to keep the oxygen concentration in the nitrogen gas flowing into the heating furnace at 0.5 vol % or less. The specific surface area of the obtained crystalline silicon nitride was 2.5 m$^2$/g, the average particle diameter was 1.5 μm, and the oxygen amount was 0.73 mass %.

An oxynitride phosphor powder was obtained by the same method as in Example 21 except that raw material powders containing the crystalline silicon nitride powder according to Example 26 were weighed and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of the oxynitride phosphor powder according to Example 26 and the measurement results of D50 and specific surface area of the oxynitride phosphor powder.

Example 27

An oxynitride phosphor powder was obtained by the same method as in Example 21 except that the heat-treatment conditions for the fired oxynitride were changed as shown in Table 4. The fluorescent properties of the obtained oxynitride phosphor powder were measured by the same methods as in Example 21. The results are shown in Table 4 together with the measurement results of oxygen amount, average particle diameter and specific surface area of the silicon nitride powder as the raw material of the oxynitride phosphor powder according to Example 27 and the measurement results of D50 and specific surface area of the oxynitride phosphor powder.

Examples 28 and 29

Oxynitride phosphor powders were obtained by the same method as in Example 21 except that raw material powders were weight and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of each of the oxynitride phosphor powders according to Examples 28 and 29 and the measurement results of D50 and specific surface area of each of the oxynitride phosphor powders.

Comparative Example 21

An oxynitride phosphor powder was obtained by the same method as in Example 21 except that raw material powders containing the crystalline silicon nitride powder according to Comparative Example 21 were weight and mixed to give an oxynitride phosphor powder having the designed composition in Table 4.

The fluorescent properties of the obtained oxynitride phosphor powder were measured by the same methods as in Example 21. The results are shown in Table 4 together with the measurement results of oxygen amount, average particle diameter and specific surface area of the crystalline silicon nitride powder as the raw material of the oxynitride phosphor powder according to Comparative Example 21 and the measurement results of D50 and specific surface area of the oxynitride phosphor powder.

Comparative Example 22

An oxynitride phosphor powder was obtained by the same method as in Example 21 except that raw material powders were weight and mixed to give an oxynitride phosphor powder having the designed composition in Table 4. The fluorescent properties of the obtained oxynitride phosphor powder were measured by the same methods as in Example 21. The results are shown in Table 4 together with the measurement results of oxygen amount, average particle diameter and specific surface area of the silicon nitride powder as the raw material of the oxynitride phosphor powder and the measurement results of D50 and specific surface area of the oxynitride phosphor powder.

TABLE 4

|  | X1 | X2 | y | Z | Silicon Nitride Powder (Raw Material) | | | Heat Treatment Temperature [° C.] | Peak Wavelength [nm] |
|---|---|---|---|---|---|---|---|---|---|
|  |  |  |  |  | Specific Surface Area (m²/g) | Average Particle Diameter (μm) | Oxygen Amount (mass %) |  |  |
| Example 21 | 2.00 | 0.20 | 4.60 | 0.00 | 0.3 | 8.0 | 0.29 | 1600 | 604.0 |
| Example 22 | 2.00 | 0.20 | 4.60 | 0.00 | 0.3 | 8.0 | 0.75 | 1600 | 604.2 |
| Example 23 | 2.00 | 0.20 | 4.60 | 0.00 | 1.0 | 3.0 | 0.34 | 1600 | 604.5 |
| Example 24 | 2.00 | 0.20 | 4.60 | 0.00 | 1.0 | 3.0 | 0.72 | 1600 | 604.6 |
| Example 25 | 2.00 | 0.20 | 4.60 | 0.00 | 2.5 | 1.5 | 0.53 | 1600 | 604.0 |
| Example 26 | 2.00 | 0.20 | 4.60 | 0.00 | 2.5 | 1.5 | 0.73 | 1600 | 604.3 |
| Example 27 | 2.00 | 0.20 | 4.60 | 0.00 | 0.3 | 8.0 | 0.29 | 1100 | 603.5 |
| Example 28 | 2.00 | 0.20 | 4.60 | 0.30 | 0.3 | 8.0 | 0.29 | 1600 | 603.5 |
| Example 29 | 2.60 | 0.17 | 5.50 | 0.00 | 0.3 | 8.0 | 0.29 | 1600 | 605.5 |
| Comparative Example 21 | 1.25 | 0.10 | 2.80 | 0.00 | 0.3 | 8.0 | 0.29 | 1600 | 600.5 |
| Comparative Example 22 | 1.52 | 0.15 | 3.50 | 0.00 | 0.3 | 8.0 | 0.29 | 1600 | 601.5 |

|  | Relative Fluorescence Intensity [%] | Absorptivity [%] | External Quantum Efficiency [%] | Internal Quantum Efficiency [%] | Phosphor Particle | |
|---|---|---|---|---|---|---|
|  |  |  |  |  | Specific Surface Area (m²/g) | D50 (μm) |
| Example 21 | 211.6 | 87.2 | 65.1 | 74.7 | 0.29 | 15.2 |
| Example 22 | 198.2 | 86.9 | 64.4 | 74.1 | 0.28 | 15.5 |
| Example 23 | 200.2 | 83.9 | 61.7 | 73.5 | 0.34 | 12.9 |
| Example 24 | 194.2 | 82.8 | 60.4 | 73.0 | 0.35 | 13.0 |
| Example 25 | 191.2 | 82.5 | 60.3 | 73.1 | 0.51 | 11.1 |
| Example 26 | 188.2 | 82.4 | 60.2 | 73.1 | 0.52 | 11.3 |
| Example 27 | 197.3 | 87.7 | 63.1 | 72.0 | 0.29 | 15.5 |
| Example 28 | 187.3 | 83.5 | 62.4 | 74.7 | 0.27 | 15.7 |
| Example 29 | 187.3 | 79.3 | 61.1 | 77.1 | 0.30 | 15.1 |
| Comparative Example 21 | 164.3 | 83.6 | 51.2 | 61.3 | 0.28 | 15.0 |
| Comparative Example 22 | 167.3 | 86.9 | 53.1 | 61.1 | 0.29 | 15.3 |

The invention claimed is:

1. An (oxy)nitride phosphor powder containing an α-SiAlON crystal phase and an aluminum nitride crystal phase, obtained by mixing a silicon source, an aluminum source, a calcium source, and a europium source to produce a composition represented by a compositional formula:

$$Ca_{x1}Eu_{x2}Si_{12-(y+z)}Al_{(y+z)}O_zN_{16-z}$$
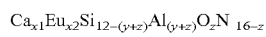

(wherein x1, x2, y and z are
$0 < x1 \leq 3.40$,
$0.05 \leq x2 \leq 0.20$,
$4.6 \leq y \leq 7.0$, and
$0 \leq z < 1$,
and firing the mixture,
wherein said (oxy)nitride phosphor powder has a content of the aluminum nitride crystal phase from 2 mass % or more to less than 32 mass %.

2. The (oxy)nitride phosphor powder according to claim 1, wherein x1, x2, y and z are:
$0 < x1 \leq 3.40$,
$0.05 \leq x2 \leq 0.020$,
$4.6 \leq y \leq 5.5$, and
$0 \leq z \leq 1$.

3. The (oxy)nitride phosphor powder according to claim 2, wherein x1, x2, y and z are:
$1.37 \leq x1 \leq 2.60$,
$0.16 \leq x2 \leq 0.20$,
$4.6 \leq y \leq 5.50$, and
$0 \leq z \leq 0.30$.

4. The (oxy)nitride phosphor powder according to claim 3,
wherein x1, x2, y and z are:
$1.70 \leq x1 \leq 2.60$,
$0.16 \leq x2 \leq 0.20$,
$4.6 \leq y \leq 5.05$, and
$0 \leq z \leq 0.10$.

5. The (oxy)nitride phosphor powder according to claim 1, wherein, in said compositional formula, the content of the aluminum nitride crystal phase is from 2 mass % or more to 25 mass % or less.

6. The (oxy) nitride phosphor powder according to claim 1, wherein an external quantum efficiency of fluorescence emitted by excitation with light having a wavelength of 450 nm is 60% or more.

7. The (oxy)nitride phosphor powder according to claim 1, having a light reflectance of 80% or more.

8. The (oxy)nitride phosphor powder according to claim 1, having a lattice constant of the α-SiAlON crystal phase constituting the (oxy)nitride phosphor powder of 7.93 Å $\leq a=b \leq 7.99$ Å and 5.75 Å $\leq c \leq 5.80$ Å.

9. The (oxy)nitride phosphor powder according to claim 1, wherein a 50% diameter ($D_{50}$) in the particle size distribution curve measured by a laser diffraction/scattering particle size distribution measuring apparatus is 10.0 to 20.0 μm and a specific surface area is 0.2 to 0.6 m²/g.

10. The (oxy)nitride phosphor powder according to claim 1, wherein an amorphous layer on the particle surface is less than 2 nm in thickness.

11. The (oxy)nitride phosphor powder according to claim 1, wherein fluorescence having a peak wavelength in a wavelength region of 595 to 605 nm is emitted by excitation with light having a wavelength of 450 nm and external quantum efficiency in light emission is 60% or more.

12. The (oxy)nitride phosphor powder according to claim 11, wherein x1, x2, y and z are:
1.37≤x1≤2.60,
0.16x2≤0.20,
4.6≤y≤5.50, and
0≤z≤0.30,
fluorescence having a peak wavelength in the wavelength region of 602 to 605 nm is emitted, and the external quantum efficiency in light emission is 60% or more.

13. A silicon nitride powder for production of oxynitride phosphor powder, which is a crystalline silicon nitride powder used as a raw material to produce the (oxy)nitride phosphor powder according to claim 1, wherein oxygen content is 0.2 to 0.9 mass %.

14. The silicon nitride powder according to claim 13, having an average particle diameter of 1.0 to 12.0 μm.

15. The silicon nitride powder according to claim 13, having a specific surface area of 0.2 to 3.0 m²/g.

16. A method of producing the oxynitride phosphor powder according to claim 1, comprising:
mixing the silicon source, the aluminum source, the calcium source, and the europium source to produce the composition represented by the compositional formula:

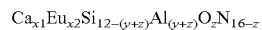

$Ca_{x1}Eu_{x2}Si_{12-(y+z)}Al_{(y+z)}O_zN_{16-z}$ (wherein x1, x2, y and z are:
0<x1≤3.40,
0.05≤x2≤0.20,
4.6≤y≤7.0, and
0≤z≤1,
firing the mixture at a temperature of 1,500 to 2,000° C. in an inert gas atmosphere to obtain a fired oxynitride represented by the formula above, and
heat-treating said fired oxynitride at a temperature of 1,100 to 1,600° C. in an inert gas atmosphere.

17. The method according to claim 16, wherein said silicon source is a silicon nitride powder and said silicon nitride powder has an oxygen content of 0.2 to 0.9 mass %, an average particle diameter of 1.0 to 12.0 μm, and a specific surface area of 0.2 to 3.0 m²/g.

* * * * *